(12) United States Patent
Lim et al.

(10) Patent No.: US 9,698,154 B2
(45) Date of Patent: Jul. 4, 2017

(54) SEMICONDUCTOR DEVICE

(71) Applicants: Joon Sung Lim, Yongin-si (KR); Kyu Baik Chang, Seoul (KR); Sung Hoi Hur, Seoul (KR); Woo Jung Kim, Seongnam-si (KR)

(72) Inventors: Joon Sung Lim, Yongin-si (KR); Kyu Baik Chang, Seoul (KR); Sung Hoi Hur, Seoul (KR); Woo Jung Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/168,349

(22) Filed: May 31, 2016

(65) Prior Publication Data

US 2017/0040335 A1 Feb. 9, 2017

(30) Foreign Application Priority Data

Aug. 6, 2015 (KR) ........................ 10-2015-0110977

(51) Int. Cl.
| | | |
|---|---|---|
| *H01L 21/764* | (2006.01) | |
| *H01L 27/115* | (2017.01) | |
| *H01L 27/11575* | (2017.01) | |
| *H01L 27/1157* | (2017.01) | |
| *H01L 27/11573* | (2017.01) | |
| *H01L 21/8238* | (2006.01) | |
| *H01L 21/8234* | (2006.01) | |

(52) U.S. Cl.
CPC .... *H01L 27/11575* (2013.01); *H01L 27/1157* (2013.01); *H01L 27/11573* (2013.01); *H01L 21/823481* (2013.01); *H01L 21/823878* (2013.01)

(58) Field of Classification Search
CPC ..... H01L 21/823481; H01L 21/823878; H01L 27/11548; H01L 27/11576; H01L 27/11595; H01L 21/76289; H01L 21/764
USPC ........................................ 257/501
See application file for complete search history.

(56) References Cited

U.S. PATENT DOCUMENTS

| | | | |
|---|---|---|---|
| 6,413,827 B2 * | 7/2002 | Farrar .................. | H01L 21/336 257/E21.546 |
| 7,709,347 B2 | 5/2010 | Sakagami | |
| 7,767,523 B2 | 8/2010 | Nakagawa | |
| 8,482,094 B2 | 7/2013 | Oh | |
| 8,610,238 B2 * | 12/2013 | Kaltalioglu ....... | H01L 21/31116 257/283 |
| 8,686,532 B2 | 4/2014 | Nakashiba | |
| 8,809,162 B2 | 8/2014 | Lee et al. | |
| 2012/0057405 A1 | 3/2012 | Ogiwara et al. | |

(Continued)

FOREIGN PATENT DOCUMENTS

KR 10-1139462 B1 5/2012
KR 2012/0129082 A 11/2012

*Primary Examiner* — George Fourson, III
(74) *Attorney, Agent, or Firm* — Harness, Dickey & Pierce, P.L.C.

(57) ABSTRACT

A semiconductor device includes a substrate, a plurality of memory cell arrays, and an air gap structure. The substrate includes a cell region, a peripheral circuit region, and a boundary region. The boundary region is between the cell region and the peripheral circuit region. The plurality of memory cell arrays are on the cell region. The air gap structure includes a trench formed in the boundary region of the substrate. The air gap structure defines an air gap.

15 Claims, 17 Drawing Sheets

(56) References Cited

U.S. PATENT DOCUMENTS

2014/0151777 A1\* 6/2014 Sim .................. H01L 29/42324
                                                                                   257/315
2016/0211139 A1\* 7/2016 Ko ........................ H01L 21/283

\* cited by examiner

SEMICONDUCTOR DEVICE

CROSS-REFERENCE TO RELATED APPLICATION

This application claims priority under 35 U.S.C. §119 to Korean Patent Application No. 10-2015-0110977, filed on Aug. 6, 2015 with the Korean Intellectual Property Office, the entire disclosure of which is incorporated herein by reference.

BACKGROUND

The present disclosure relates to a semiconductor device.

Electronic products are increasingly being used to perform high capacity data processing while the volumes thereof are gradually being reduced. Thus, semiconductor memory devices used in such electronic products may have an increased degree of integration. As a method in which the integration of semiconductor memory devices may be increased, a memory device having a vertical transistor structure rather than having a planar transistor structure has been proposed.

SUMMARY

According to example embodiments, a semiconductor device having an air gap structure by which an amount of heat generated in a peripheral circuit region during operation of the semiconductor device may be reduced or such heat may be prevented from being transferred to a memory cell region.

According to example embodiments of inventive concepts, a semiconductor device may include a substrate, a plurality of memory cell arrays, and an air gap structure. The substrate includes a cell region, a peripheral circuit region, and a boundary region. The boundary region is between the cell region and the peripheral circuit region. The plurality of memory cell arrays are on the cell region. The air gap structure includes a trench formed in the boundary region. The air gap structure defines an air gap. The air gap structure may limit and/or prevent heat from being transferred to the cell region from the peripheral circuit region.

In example embodiments, the semiconductor device may include a plurality of air gap structures. The plurality of air gap structures may include the air gap structure. Each one of the air gap structures may extend in a single direction along one side of the memory cell arrays.

In example embodiments, a length of the air gap structure may respectively correspond to a length of the one side of each of the plurality of memory cell arrays.

In example embodiments, the air gap structure may be continuous, without being disconnected, to correspond to all of the plurality of memory cell arrays, and the air gap structure may extend along sides of the plurality of memory cell arrays in a single direction.

In example embodiments, the air gap structure may have a linear form.

In example embodiments, the air gap structure comprises a plurality of trenches spaced apart from each other while having linear forms, the plurality of trenches include the trench, and depths of the plurality of trenches are equal to each other.

In example embodiments, the air gap structure comprises a plurality of trenches spaced apart from each other while having linear forms, the plurality of trenches include the trench, and depths of the plurality of trenches are different from each other.

In example embodiments, the air gap structure may have a linear form when viewed from above.

In example embodiments, the air gap structure may have a zigzag form when viewed from above.

In example embodiments, the air gap structure may have a ladder form when viewed from above.

According to example embodiments of inventive concepts, a semiconductor device may include a substrate, a non-volatile memory device and logic elements on the substrate, and an air gap structure. The non-volatile memory device includes a cell region containing a plurality of memory cell arrays on a cell region, and a core logic circuit on a peripheral circuit region. An air gap structure defines an air gap in a trench formed in the substrate between the cell region and the peripheral circuit region and between the cell region and the logic elements. Heat from the peripheral circuit region and the logic elements may be limited and/or prevented from being transferred to the cell region.

In example embodiments, the air gap structure may surround all of the plurality of memory cell arrays in a single quadrangular circumferential form.

In example embodiments, the semiconductor device may include a plurality of air gap structures defining a plurality of air gaps in a plurality of trenches, respectively, formed in the substrate. The air gap structures may include the air gap structure. The air gap structures may be respectively arranged with each of the plurality of memory cell arrays, and each of the air gap structures may surround a corresponding one of the plurality of memory cell arrays in a quadrangular circumferential form.

According to example embodiments of inventive concepts, a semiconductor device may include a substrate, a core logic circuit, and an air gap structure. The substrate includes a cell region, a peripheral circuit region, and a boundary region. The boundary region is between the cell region and the peripheral circuit region. The boundary region includes a trench. The core logic circuit is on the peripheral circuit region. The air gap structures define an air gap in the trench formed in the boundary region. The air gap structure may limit and/or prevent heat from being transferred to the cell region from the peripheral circuit region.

In example embodiments, the semiconductor device may further include a plurality of memory cell arrays on the cell region, and a plurality of air gap structures. The plurality of air gap structures may include the air gap structure. The boundary region may include a plurality of trenches formed in the substrate. The plurality of trenches may include the trench. Each one of the air gap structures may extend in a single direction along one side of a corresponding one of the memory cell arrays.

In example embodiments, the air gap structure may have a linear form, a zig zag form, or a ladder form, when viewed from above.

In example embodiments, the air gap structure may include an insulating layer in the trench. The insulating layer may define the air gap.

In example embodiments, the semiconductor device may further include a plurality of memory cell arrays on the cell region. The plurality of memory cell arrays may each include a plurality of memory cell strings on the cell region of the substrate, and the memory cell strings may each include a plurality of memory cells stacked on top of each other between a ground selection transistor and a string selection transistor.

BRIEF DESCRIPTION OF DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
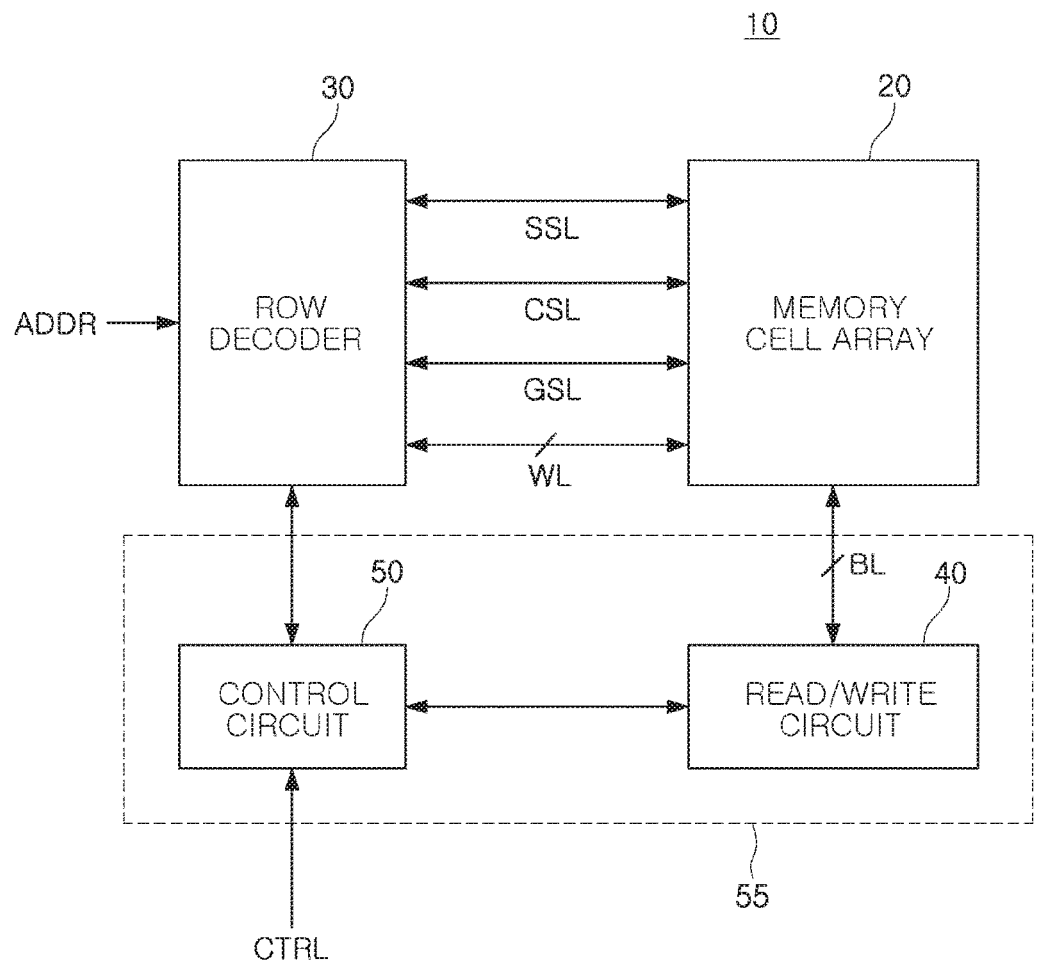
FIG. 1 is a schematic block diagram of a semiconductor device according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the example embodiments.

Spatially relative terms, such as "above," "upper," "below," and "lower" and the like, may be used herein for ease of description to describe one element's relationship to another element (s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of inventive concepts. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, example embodiments of inventive concepts will be described with reference to schematic views illustrating embodiments of inventive concepts. In the drawings, for example, due to manufacturing techniques and/or tolerances, modifications of the shape shown may be estimated. Thus, example embodiments of inventive concepts should not be construed as being limited to the particular shapes of regions shown herein, for example, to include a change in shape results in manufacturing. The following example embodiments may also be constituted by one or a combination thereof.

Example embodiments of inventive concepts described below may have a variety of configurations and are not limited to the examples discussed below.

FIG. 1 is a schematic block diagram of a semiconductor device according to example embodiments of inventive concepts.

With reference to FIG. 1, a semiconductor device 10 according to example embodiments of inventive concepts may include a memory cell array 20, a row decoder 30, and a core logic circuit 55. The core logic circuit 55 may include a read/write circuit 40 and a control circuit 50.

The memory cell array 20 may include a plurality of memory cells arranged in a plurality of rows and a plurality of columns. The plurality of memory cells included in the memory cell array 20 may be connected to the row decoder 30 through a word line WL, a common source line CSL, a string select line SSL, a ground select line GSL, and the like, and may be connected to the read/write circuit 40 through a bit line BL. In example embodiments of inventive concepts, a plurality of memory cells arranged linearly in a single row may be connected to a single word line WL, and a plurality of memory cells arranged linearly in a single column may be connected to a single bit line BL.

The plurality of memory cells included in the memory cell array 20 may be divided into a plurality of memory blocks. A respective memory block may include a plurality of word lines WL, a plurality of string select lines SSL, a plurality of ground select lines GSL, a plurality of bit lines BL, and at least one common source line CSL.

The row decoder 30 may receive externally provided address information ADDR, and may decode the received address information ADDR to select at least a portion of the word line WL, the common source line CSL, the string select line SSL, and the ground select line GSL connected to the memory cell array 20.

The read/write circuit 40 may select at least a portion of bit lines BL connected to the memory cell array 20 in response to a command provided from the control circuit 50. The read/write circuit 40 may read data stored to a memory cell connected to the selected at least a portion of bit lines BL or may write data to a memory cell connected to the selected at least a portion of bit lines BL. The read/write circuit 40 may include a circuit such as a page buffer, an input/output buffer, a data latch, and the like.

The control circuit 50 may control operations of the row decoder 30 and the read/write circuit 40 in response to a control signal CTRL transferred externally. In the case of reading data stored to the memory cell array 20, the control circuit 50 may control operations of the row decoder 30 to supply a voltage to the word line WL in which the data to be read is stored for a reading operation. When the voltage for a reading operation is supplied to a specific word line WL, the control circuit 50 may perform controlling so that the read/write circuit 40 may read data stored to a memory cell connected to the word line WL having received the voltage for a reading operation.

In different manners, for example, when data is written to the memory cell array 20, the control circuit 50 may control operations of the row decoder 30 to supply a voltage for a writing operation to a word line WL to which the data is to be written. When the voltage for a writing operation is supplied to a specific word line WL, the control circuit 50 may control the read/write circuit 40 to write data to a memory cell connected to the word like WL to which the voltage for a writing operation has been supplied.

Figure 2:
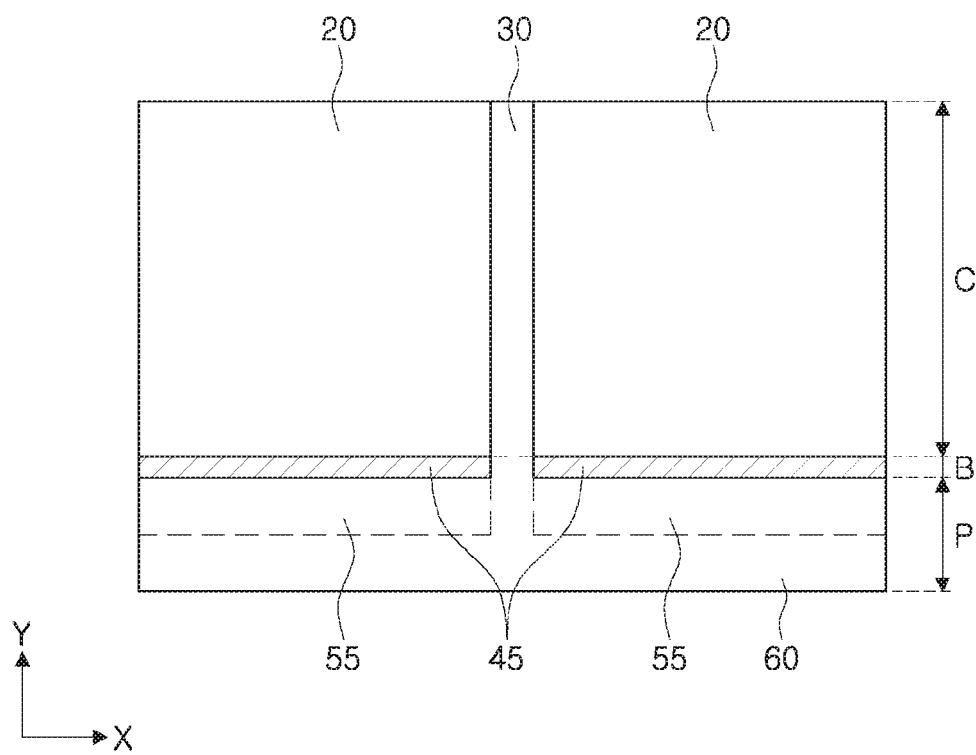
FIG. 2 is a schematic layout diagram of a semiconductor device according to example embodiments of inventive concepts.

FIG. 2 is a schematic layout diagram of a semiconductor device according to example embodiments of inventive concepts.

With reference to FIG. 2, a semiconductor device 10 according to example embodiments of inventive concepts may include a cell region C, a peripheral circuit region P, and a boundary region B between the cell region C and the peripheral circuit region P. The cell region C may include a plurality of memory cell arrays 20, and the peripheral circuit region P may include a row decoder 30, a core logic circuit 55, and other peripheral circuits 60.

In the cell region C, the memory cell arrays 20 may be disposed on both sides of the row decoder 30, based on the row decoder 30.

In the peripheral circuit region P, the core logic circuit 55 may be disposed to correspond to a respective memory cell array 20. In addition, other peripheral circuits 60 may be disposed in the vicinity of the core logic circuit 55, and may include a high voltage generating circuit, and the like. Such dispositional relationships between the memory cell arrays and the peripheral circuits illustrated in FIG. 2 are provided by way of example. Thus, an internal dispositional relationship of the semiconductor device according to example embodiments is not limited thereto.

The boundary region B may include an air gap structure 45 limiting and/or preventing heat from being transferred from the peripheral circuit region P to the cell region C or reducing an amount of heat being transferred. In detail, the air gap structure 45 may be disposed in the boundary region B between the memory cell arrays 20 and the core logic circuits 55. Each memory cell array 20 may be provided with the air gap structure 45. For instance, a plurality of air gap structures 45 may correspond to the plurality of memory cell arrays 20 in one to one correspondence. Each air gap structure 45 may extend in a one direction, for example, an X-axis direction, along one side of the memory cell array 20, and may have a length corresponding to a length of one side of the memory cell array 20. In a manner different therefrom, a single air gap structure 45 extending in the one direction, for example, an X-axis direction, may be provided continuously, without being disconnected, to correspond to the entirety of the memory cell arrays 20, rather than being separately provided to respectively correspond to respective memory cell arrays 20.

Heat may be generated in the core logic circuit 55 and/or other peripheral circuits 60 during operation of the semiconductor device 10, and the generated heat may be transferred to the memory cell arrays 20 through the substrate and/or an interlayer insulating layer. In detail, memory cells adjacent to the core logic circuit 55 may be exposed to a relatively high temperature, as compared to memory cells away from the core logic circuit 55. In this case, memory cell characteristics may be further degraded in the memory cells relatively adjacent to the core logic circuit 55. Thus, according to example embodiments of inventive concepts, the air gap structure 45 may be formed between the memory cell array 20 and the core logic circuit 55 to block or reduce heat transferred to the memory cell array 20, thereby limiting and/or preventing degradation in memory cell characteristics. A structure of the air gap structure 45 will be described below in more detail with reference to FIGS. 4 to 11.

Figure 3:
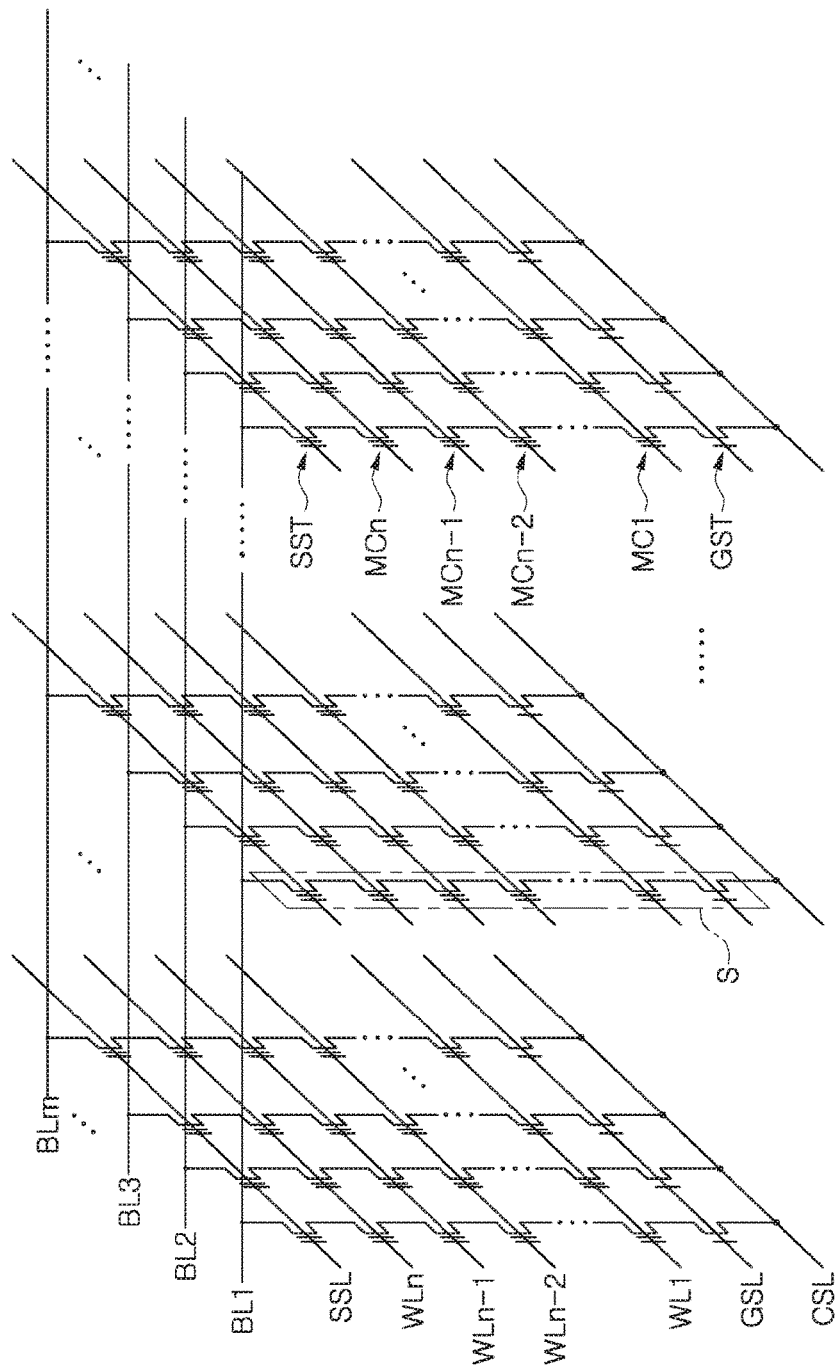
FIG. 3 is a circuit diagram of a memory cell array of a semiconductor device according to example embodiments of inventive concepts.

FIG. 3 is an equivalent circuit diagram of a memory cell array of a semiconductor device according to example embodiments of inventive concepts. A semiconductor device according to example embodiments of inventive concepts may be a vertical NAND flash device.

Referring to FIG. 3, a memory cell array may include a plurality of memory cell strings S including n number of memory cells MC1 to MCn connected to one another in series, and a ground selection transistor GST and a string selection transistor SST respectively connected to two ends of the n number of memory cells MC1 to MCn in series.

The n number of memory cells MC1 to MCn connected to one another in series may be connected to n number of word lines WL1 to WLn to select the n number of memory cells MC1 to MCn, respectively.

Gate terminals of the ground selection transistors GST may be connected to a ground select line GSL, and source terminals thereof may be connected to a common source line CSL. In a different manner, gate terminals of the string selection transistors SST may be connected to a string select line SSL, and source terminals thereof may be connected to drain terminals of memory cells MCn. Although FIG. 3 illustrates a structure in which one ground selection transistor GST and one string selection transistor SST are respectively connected to the n number of memory cells MC1 to MCn connected to one another in series; in a manner different therefrom, a plurality of ground selection transistors GST or a plurality of string selection transistors SST may be connected thereto.

Drain terminals of the string selection transistors SST may be connected to a plurality of bit lines BL1 to BLm. When a signal is applied to gate terminals of the string selection transistors SST through the string select line SSL, the signal applied through the bit lines BL1 to BLm may be transferred to the n number of memory cells MC1 to MCn connected to one another in series, and thus, a data reading operation or a data writing operation may be performed.

Figure 4:
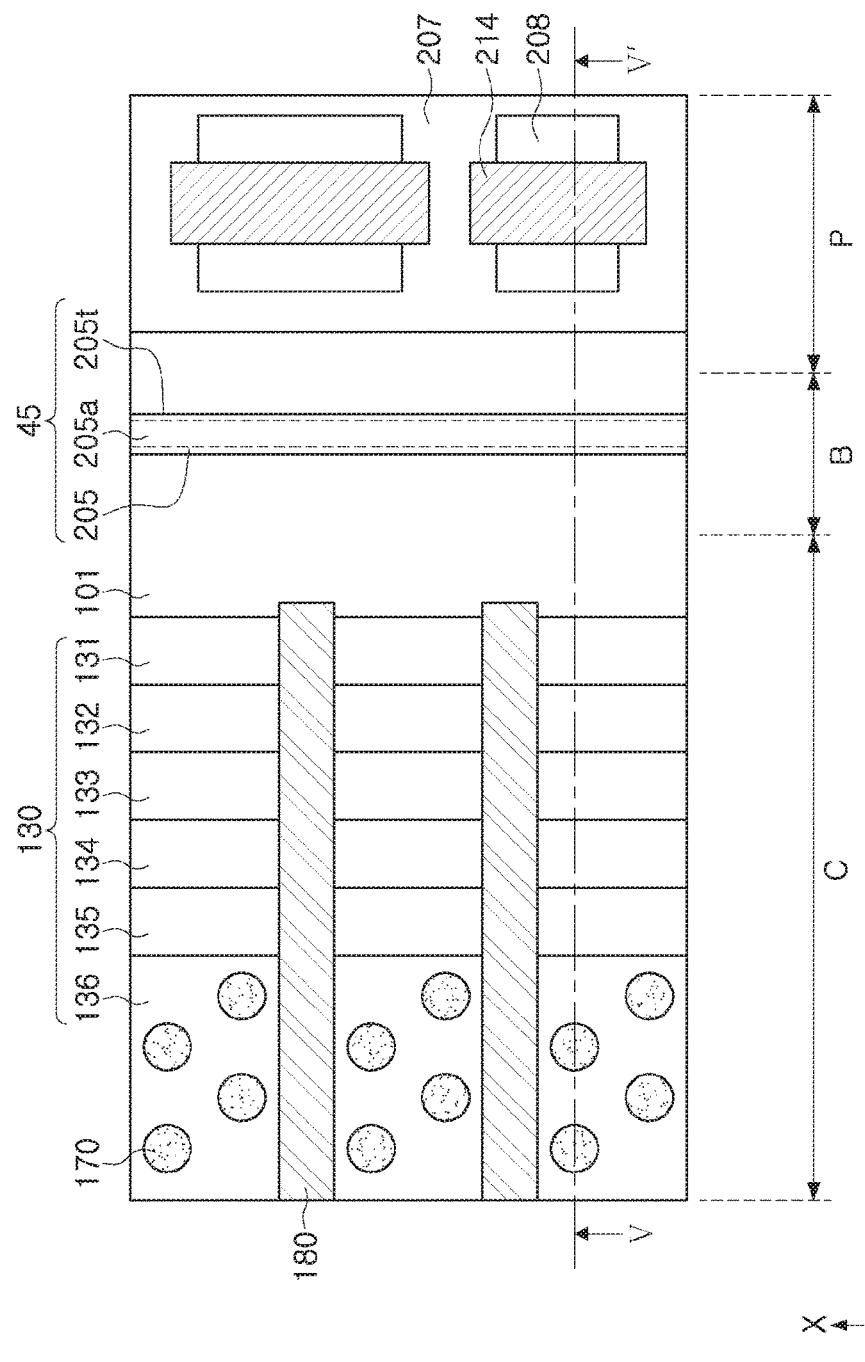
FIG. 4 is a schematic plan view illustrating a portion of a semiconductor device according to example embodiments of inventive concepts.
Figure 5:
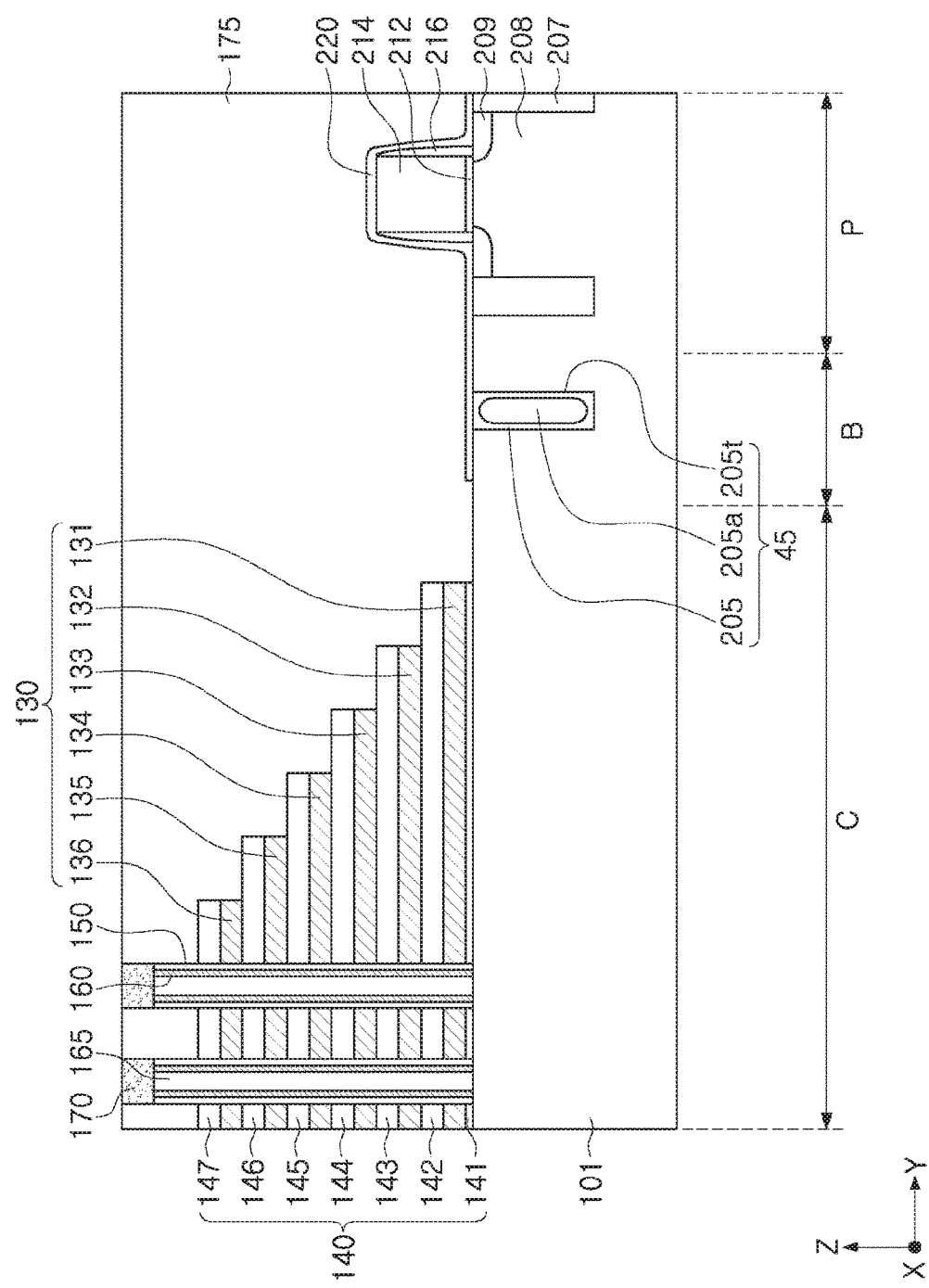
FIG. 5 is a schematic cross-sectional view of a semiconductor device taken along line V-V' of FIG. 4.

FIG. 4 is a schematic plan view illustrating a portion of a semiconductor device according to example embodiments of inventive concepts. FIG. 5 is a schematic cross-sectional view of a semiconductor device taken along line V-V' of FIG. 4. The cell region C in FIGS. 4 and 5 illustrate a portion of a memory cell array of the vertical NAND flash memory device described above with reference to FIG. 3. FIG. 4 illustrates that principal configurations are formed on a substrate 101 (see FIG. 5), from which a portion of constituent elements such as an interlayer insulating layer 175, an etch-stop layer 220, and the like are omitted.

With reference to FIG. 4, in a semiconductor device according to example embodiments of inventive concepts, the substrate 101 may include a cell region C, a peripheral circuit region P, and a boundary region B disposed therebetween. The cell region C may include a plurality of gate electrode layers 131 to 136 (gate electrode layers 130), channel pads 170, and conductive layers 180. The peripheral circuit region P may include a device isolation layer 207 defining an active region 208, and a gate electrode 214 intersecting the active region 208. The active region 208 and the gate electrode 214 may form a peripheral transistor. The boundary region B may include an air gap structure 45 limiting and/or preventing heat from being transferred from the peripheral circuit region P to the cell region C or reducing an amount of heat being transferred.

A plurality of insulating layers 140 (see FIG. 5) may be disposed between the plurality of gate electrode layers 130. The plurality of gate electrode layers 130 and the plurality of insulating layers 140 may extend, for example, in a Y-axis direction. Among the plurality of gate electrode layers 130 and the plurality of insulating layers 140, layers relatively closer to the substrate 101 may be further extended in a Y-axis direction to form a plurality of step portions formed in a stepped shape.

The substrate 101 may have an upper surface extending in an X-axis direction and a Y-axis direction. The substrate 101 may contain a semiconductor material, for example, a group IV semiconductor material, a group III-V compound semiconductor material, or a group II-VI compound semiconductor material. For example, the group IV semiconductor may contain silicon, germanium, or silicon-germanium. The substrate 101 may be provided as a bulk wafer, an epitaxial layer, a silicon on insulator (SOI) layer, or a semiconductor on insulator (SeOI), or the like.

The gate electrodes layers 130, for example, 131 to 136, may contain polycrystalline silicon or a metal silicide material. The metal silicide material may be a silicide material of a metal selected from among, for example, cobalt (Co), nickel (Ni), hafnium (Hf), platinum (Pt), tungsten (W) and titanium (Ti), or may be a combination thereof. According to example embodiments, the gate electrode layers 130 may also contain a metal, for example, tungsten (W). In addition, although not illustrated in the drawings, the gate electrode layers 130 may further include a diffusion barrier layer, and for example, the diffusion barrier layer may contain tungsten nitride (WN), tantalum nitride (TaN), titanium nitride (TiN) or a combination thereof. The insulating layers 140 may include an insulating material such as silicon oxide or silicon nitride.

The channel pads 170 may be disposed on channel regions 160 (see FIG. 5) penetrating through the gate electrode layers 131 to 136 (gate electrodes 130), and the channel pads 170 may be disposed in a zigzag manner in a single direction, for example, a Y-axis direction. The channel pads 170 may contain, for example, doped polycrystalline silicon. The channel pads 170 may serve as drain regions of the string selection transistor SST illustrated in FIG. 3.

The conductive layers 180 may penetrate through the plurality of gate electrode layers 130 and the plurality of insulating layers 140 to be connected to the substrate 101. The conductive layers 180 may extend in a Y-axis direction while having a linear shape. The active regions 180 may be arranged in an X-axis direction with a desired (and/or alternatively predetermined) distance therebetween and are not limited to the arrangement depicted in the drawings. The conductive layers 180 may form the common source line CSL illustrated in FIG. 3. The conductive layers 180 may include a metal such as tungsten (W), aluminum (Al), copper (Cu), and the like. An insulating layer may further be disposed between the conductive layers 180 and the gate insulating layers 130. The conductive layers 180 may be electrically insulated from the gate electrode layers 130 by the insulating layer.

The peripheral circuit region P may include a device isolation layer 207 defining an active region 208, and a gate electrode 214 intersecting the active region 208. The active region 208 and the gate electrode 214 may form peripheral transistors. The peripheral transistors may configure the core logic circuit 55 illustrated in FIG. 1, and the like. Although FIG. 4 illustrates two peripheral transistors, the number and a relative size of peripheral transistors included in the peripheral circuit region P are not limited thereto.

The air gap structure 45 may include a trench 205t extending, for example, in an X-axis direction to have a linear form in the substrate 101, an insulating layer 205 partially filling the trench 205t, and an air gap 205a surrounded by the insulating layer 205. The air gap structure 45 may have a linear form when viewed from above. For instance, the trench 205t may have a linear form when viewed from above. The air gap 205a may be continuously formed without being disconnected in the trench 205t. According to example embodiments, the air gap structure 45 may include a plurality of trenches 205t spaced apart from each other while having linear forms in a Y-axis direction. The insulating layer 205 may be formed during a manufacturing stage in which the device isolation layer 207 is formed. According to example embodiments, the insulating layer 205 may be formed during a stage separate from a manufacturing stage in which the device isolation layer 207 is formed.

With reference to FIG. 5, the substrate 101 may include a cell region C, a peripheral circuit region P and a boundary region B disposed therebetween.

In the cell region C, the plurality of gate electrode layers 131 to 136 (gate electrode layers 130) stacked on an upper surface of the substrate 101 in a Z-axis direction, and the plurality of insulating layers 141 to 147 (insulating layers 140) disposed alternately with the plurality of gate electrode layers 130 may be included. The plurality of gate electrode layers 130 and the plurality of insulating layers 140 may extend, for example, in a Y-axis direction. The cell region C, a channel region 160 may be further provided while extending to penetrate through the plurality of gate electrode layers 130 and the plurality of insulating layers 140 so as to be substantially perpendicular to an upper surface of the substrate 101, for example, in a Z-axis direction. The channel region 160 may be formed in an opening portion having a circular cross-sectional surface. In addition, an embedded insulating layer 165 (e.g., silicon oxide) may also be formed in the channel region 160 having a central hollow portion. The channel pad 170 may be arranged on the channel region 160, and a bit line may be connected to the channel region 160 through the channel pad 170. The channel region 160 may be disposed to have a zigzag form, for example, in a Y-axis direction. However, the disposition of the channel region 160 may be variously changed according to example embodiments and is not limited to the illustration.

A gate insulating layer 150 may be disposed between the channel region 160 and the gate electrode layers 130. The gate insulating layer 150 may include a blocking layer, a charge storage layer, and a tunneling layer. The tunneling layer may be disposed adjacently to the channel region 160, and the blocking layer may be disposed adjacently to the gate electrode layers 130. The gate insulating layer 150 may be extended to an upper portion of the substrate 101. According to example embodiments, the gate insulating layer 150 may be disposed to surround the gate electrode layers 130. According to example embodiments, the charge storage layer and the tunneling layer of the gate insulating layer 150 may be disposed outwardly of the channel region 160 while extending to be parallel to the channel region 160, and the blocking layer may be disposed to surround the gate electrode layers 130. The blocking layer may include silicon oxide ($SiO_2$), silicon nitride ($Si_3N_4$), silicon oxynitride (SiON), or a high-K dielectric material. The high-K dielectric material may be any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). In a different manner, selectively, the blocking layer may include a plurality of layers having different dielectric constants. In this case, as a layer having a relatively low dielectric constant is disposed more adjacent to the channel region 160 than a layer having a relatively high dielectric constant thereto, memory device characteristics, such as erase characteristics may be improved by adjusting an energy band including barrier height. The charge storage layer may be an insulating layer including a charge trapping layer or conductive nanoparticles. For example, the charge trapping layer may contain silicon nitride. The tunneling layer may be formed of a material having a dielectric constant lower than that of the blocking layer. The tunneling layer may contain at least one of silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), and zirconium oxide ($ZrO_2$).

In the case of the gate electrode layers 130 and the insulating layers 140, layers relatively closer to the substrate 101 may be further extended in a Y-axis direction to form a plurality of step portions formed in a stepped shape. The plurality of gate electrode layers 130 and insulating layers 140 may respectively extend by different lengths in a Y-axis direction to form the plurality of step portions to thus form a plurality of pad regions. Although FIG. 5 illustrates that the insulating layers 140 are located higher than positions of the gate electrode layers 130 in a Z-axis direction in the respective pad regions, in a manner different therefrom, the gate electrode layers 130 may be located higher than positions of the insulating layers 140.

The peripheral circuit region P may include a device isolation layer 207 defining an active region 208, and a gate electrode 214 disposed on the active region 208. A gate insulating layer 212 may be interposed between the active region 208 and the gate electrode 214. A gate spacer 216 may be disposed on two sidewalls of the gate electrode 214. A source/drain region 209 into which an n-type or p-type impurity is injected may be formed in the active region 208 at two sides of the gate electrode 214.

The gate electrode 214 may include at least one of polysilicon, a metal such as tungsten, molybdenum, or the like, and metal silicide. The gate electrode 214 may also have a structure in which a polysilicon layer and a metal silicide layer are stacked. The gate insulating layer 212 may include silicon oxide ($SiO_2$), silicon nitride ($Si_3N_4$), silicon oxynitride (SiON), or a high-K dielectric material. The gate spacer 216 may be formed of silicon oxide ($SiO_2$), silicon nitride ($Si_3N_4$), silicon oxynitride (SiON), or a combination thereof.

An etch-stop layer 220 covering the gate electrode 214, the device isolation layer 207, the air gap structure 45, and the like may be formed in the peripheral circuit region P and the boundary region B. The etch-stop layer 220 may be formed of silicon nitride ($Si_3N_4$), silicon oxynitride (SiON), or a combination thereof.

The air gap structure 45 may include, for example, a trench 205t formed by etching the substrate 101, an insulating layer 205 partially filling the trench 205t, and an air gap 205a surrounded by the insulating layer 205. A depth of the trench 205t may be the same as that of a peripheral trench forming the device isolation layer 207 located in the peripheral circuit region P. In example embodiments, a depth of the trench 205t may be greater than that of the peripheral trench. An aspect ratio of the trench 205t may be greater than that of the peripheral trench. The trench 205t may be formed during a manufacturing stage in which a peripheral trench is formed. According to example embodiments, the trench 205t may also be formed during a separate stage from a manufacturing stage in which the peripheral trench is formed.

In example embodiments, the air gap structure 45 may include the plurality of trenches 205t spaced apart from each other. The plurality of trenches 205t may be formed to have the same depth. The plurality of trenches 205t may also be formed to have different depths.

The insulating layer 205 may be formed during a manufacturing stage in which the device isolation layer 207 is formed. In example embodiments, the insulating layer 205 may also be formed during a separate stage from a manufacturing stage in which the device isolation layer 207 is formed. An upper surface of the insulating layer 205 is illustrated as being coplanar with an upper surface of the substrate 101, but is not limited thereto. The insulating layer 205 may be formed in such a manner that an upper surface thereof is located higher than the upper surface of the substrate 101.

The interlayer insulating layer 175 may be disposed to cover the entirety of the cell region C, the boundary region B, and the peripheral circuit region P, on the substrate 101. In the cell region C, the interlayer insulating layer 175 may cover the plurality of gate electrode layers 130 and insulating layers 140. In the boundary region B and the peripheral circuit region P, the interlayer insulating layer 175 may cover the etch-stop layer 220. According to example embodiments, the interlayer insulating layer 175 may be disposed on another interlayer insulating layer that is previously formed in the boundary region B and the peripheral circuit region P.

Figure 6:
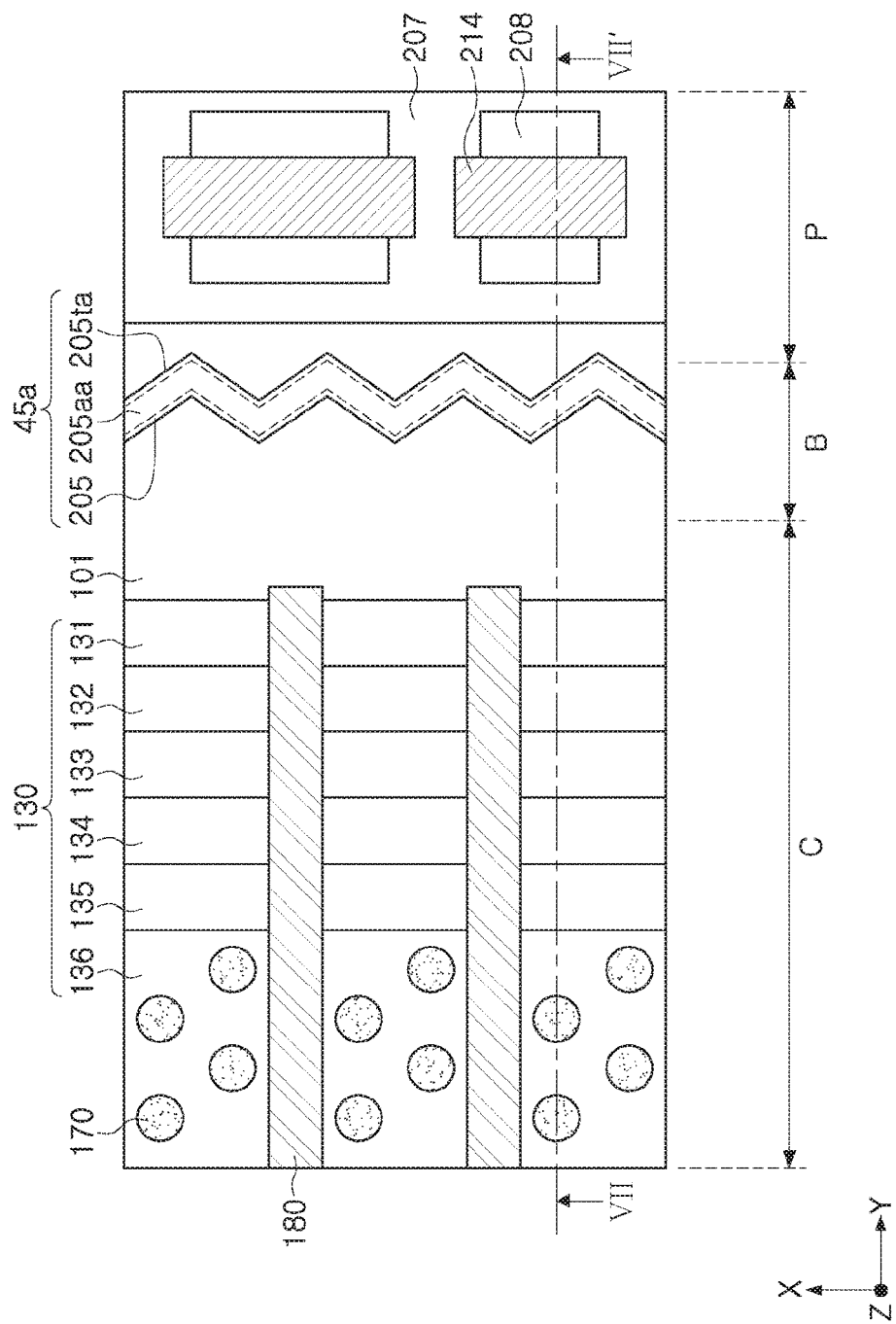
FIG. 6 is a schematic plan view illustrating a portion of a semiconductor device according to example embodiments of inventive concepts.
Figure 7:
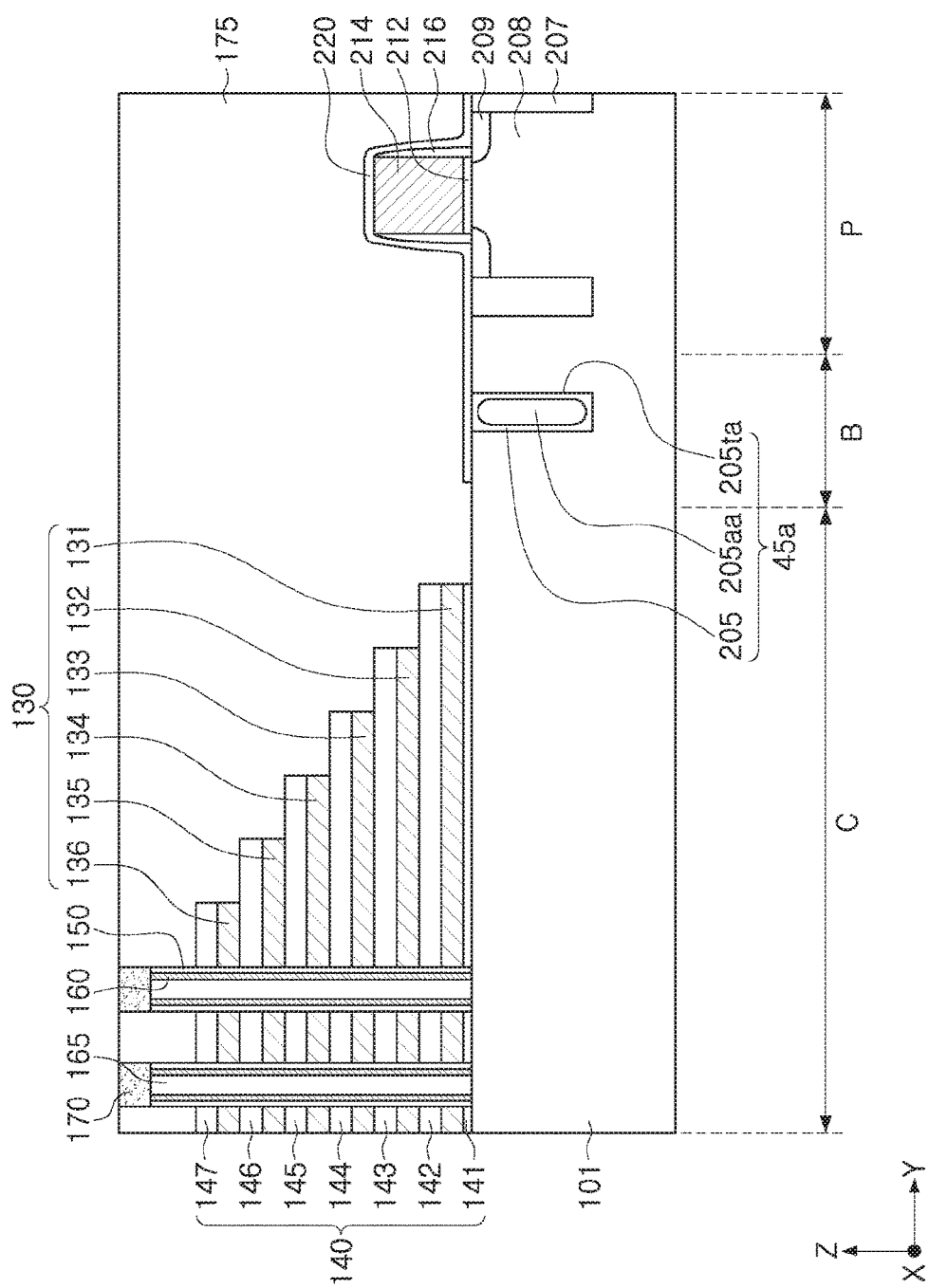
FIG. 7 is a schematic cross-sectional view of a semiconductor device taken along line VII-VII' of FIG. 6 according to example embodiments of inventive concepts.

FIG. 6 is a schematic plan view illustrating a portion of a semiconductor device according to example embodiments of inventive concepts. FIG. 7 is a schematic cross-sectional view of a semiconductor device taken along line VII-VII' of FIG. 6 according to example embodiments of inventive concepts. In a semiconductor device illustrated in FIGS. 6 and 7, constituent elements except for an air gap structure 45a formed in a boundary region B are the same as those described above with reference to FIGS. 4 and 5, and thus, a description thereof will be omitted.

With reference to FIGS. 6 and 7, the air gap structure 45a may include, for example, a trench 205ta extending in an X-axis direction in a substrate 101, an insulating layer 205 partially filling the trench 205ta, and an air gap 205aa surrounded by the insulating layer 205. The air gap structure 45a may have a zigzag form extending while being bent to have a triangular sawtooth shape when viewed from above. For instance, the trench 205ta may be formed in a zigzag manner in such a way that it is extended while being bent to have a sawtooth shape when viewed from above. The air gap 205aa may be continuously formed without being disconnected within the trench 205ta. A depth of the trench 205ta may be the same as that of a peripheral trench for formation of a device isolation layer 207 located in a peripheral circuit region P. In example embodiments, a depth of the trench 205ta may be greater than that of the peripheral trench for the formation of the device isolation layer 207. An aspect ratio of the trench 205ta may be greater than that of the peripheral trench for the formation of the device isolation layer 207.

Figure 8:
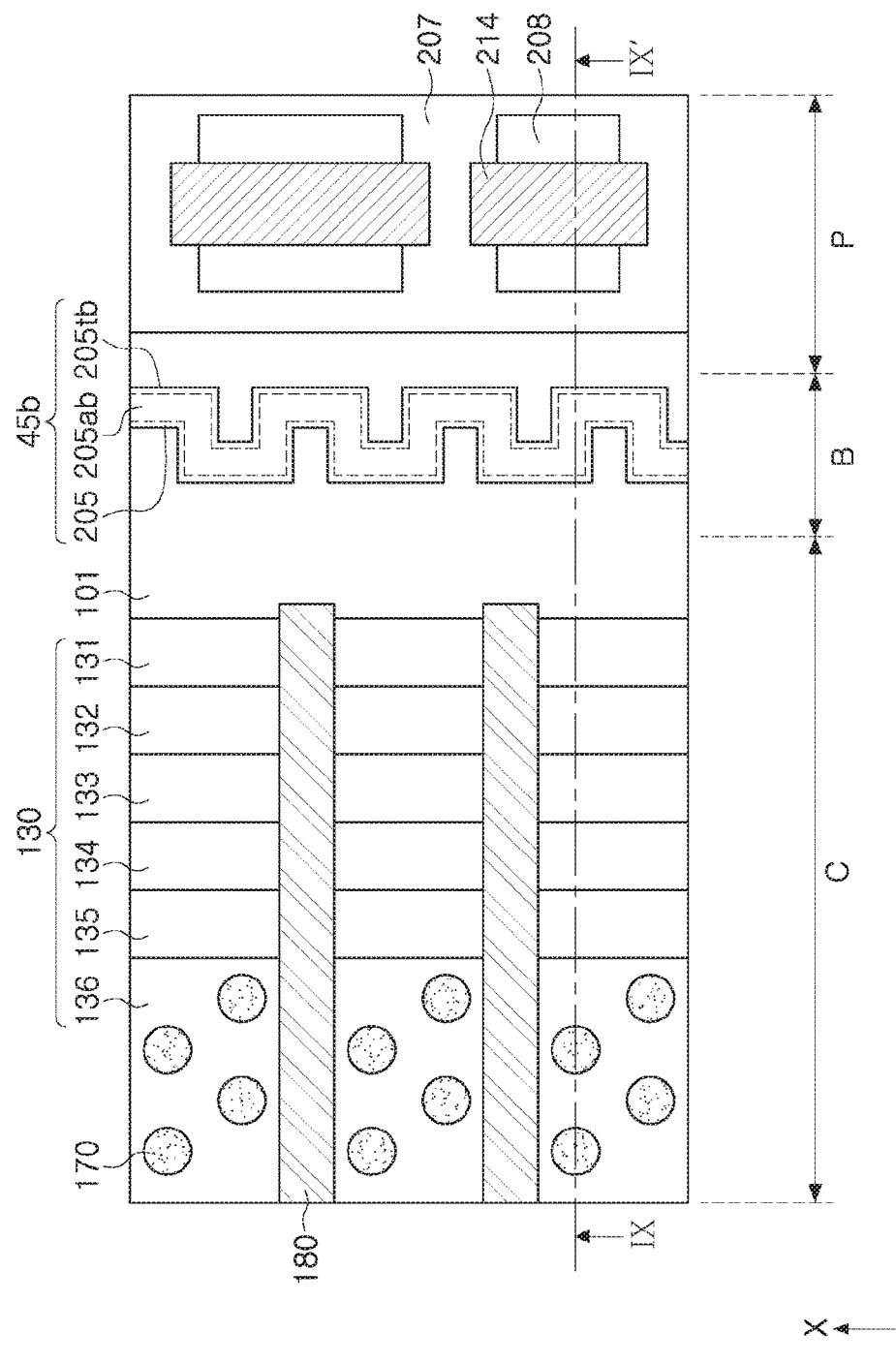
FIG. 8 is a schematic plan view illustrating a portion of a semiconductor device according to example embodiments of inventive concepts.
Figure 9:
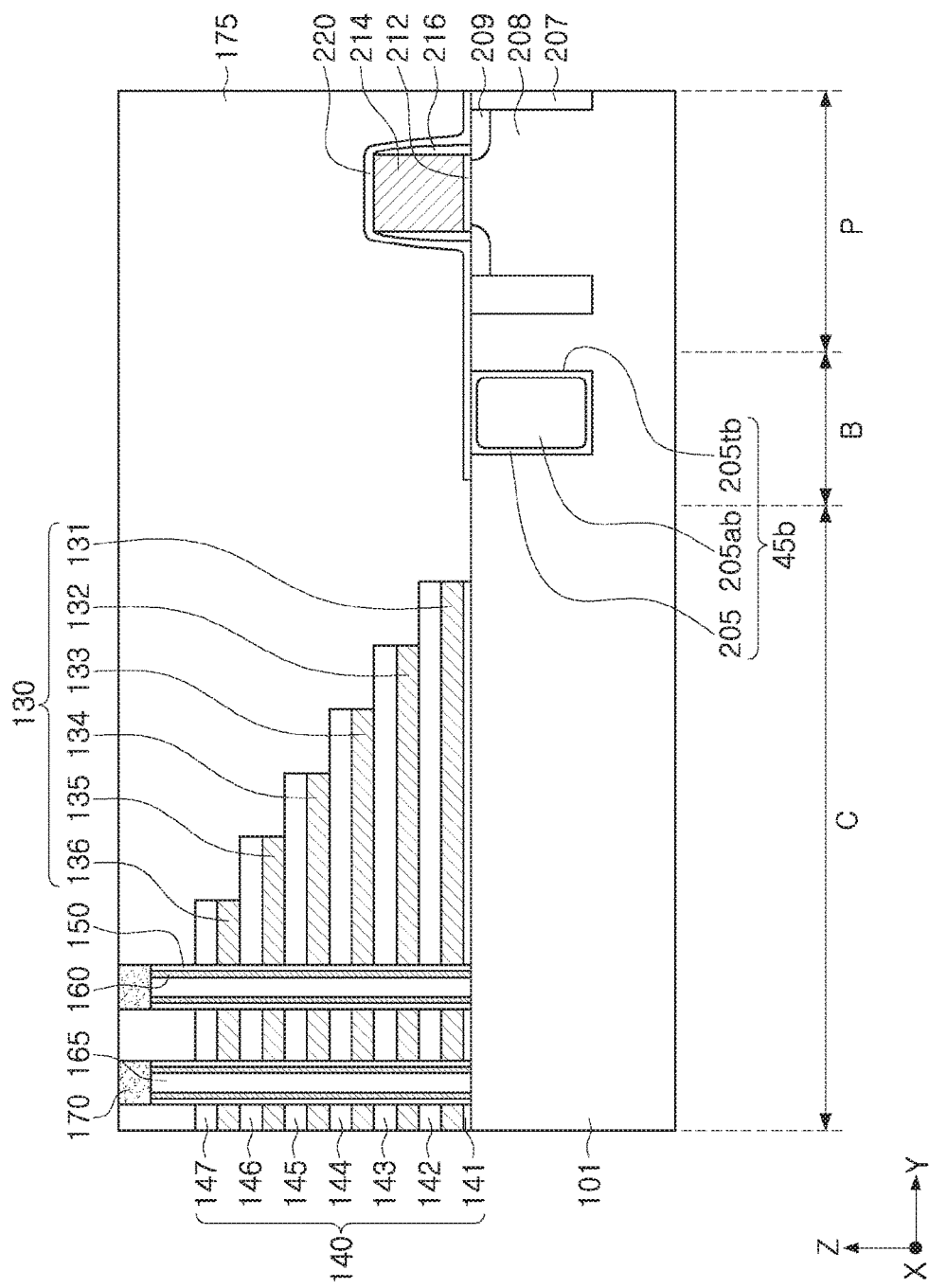
FIG. 9 is a schematic cross-sectional view of a semiconductor device taken along line IX-IX' of FIG. 8 according to example embodiments of inventive concepts.

FIG. 8 is a schematic plan view illustrating a portion of a semiconductor device according to example embodiments of inventive concepts. FIG. 9 is a schematic cross-sectional view of a semiconductor device taken along line IX-IX' of FIG. 8 according to example embodiments of inventive concepts. In a semiconductor device illustrated in FIGS. 8 and 9, constituent elements except for an air gap structure 45b formed in a boundary region B are the same as those described above with reference to FIGS. 4 and 5, and thus, a description thereof will be omitted.

With reference to FIGS. 8 and 9, the air gap structure 45b may include, for example, a trench 205tb extending in an X-axis direction in a substrate 101, an insulating layer 205 partially filling the trench 205tb, and an air gap 205ab surrounded by the insulating layer 205. The air gap structure 45b may have a meandering form (or a zigzag form) extending while being bent to have a quadrangular sawtooth shape when viewed from above, for example, extending while being alternately bent in an X-axis direction, a Y-axis direction, an X-axis direction, and a Y-axis direction, by a desired (and/or alternatively predetermined) length. For instance, the trench 205tb may be formed in a meandering form (or in a zigzag form) in such a way that it is extended while being bent to have a quadrangular sawtooth shape when viewed from above. The air gap 205ab may be continuously formed without being disconnected in the trench 205tb. A depth of the trench 205tb may be the same as that of a peripheral trench for formation of a device isolation layer 207 located in a peripheral circuit region P. In example embodiments, a depth of the trench 205tb may be greater than that of the peripheral trench for the formation of the device isolation layer 207. An aspect ratio of the trench 205tb may be greater than that of the peripheral trench for the formation of the device isolation layer 207.

Figure 10:
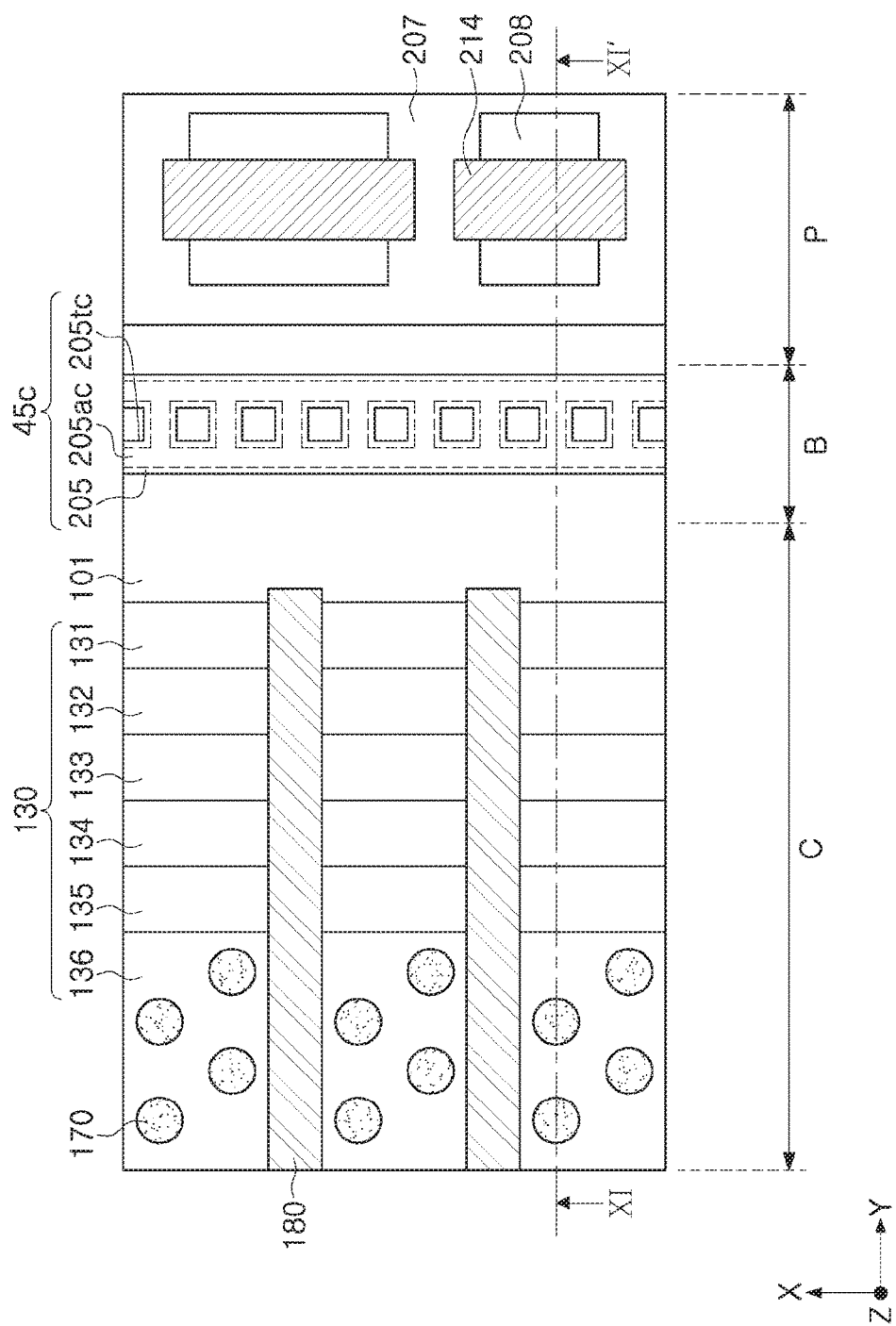
FIG. 10 is a schematic plan view illustrating a portion of a semiconductor device according to example embodiments of inventive concepts.
Figure 11:
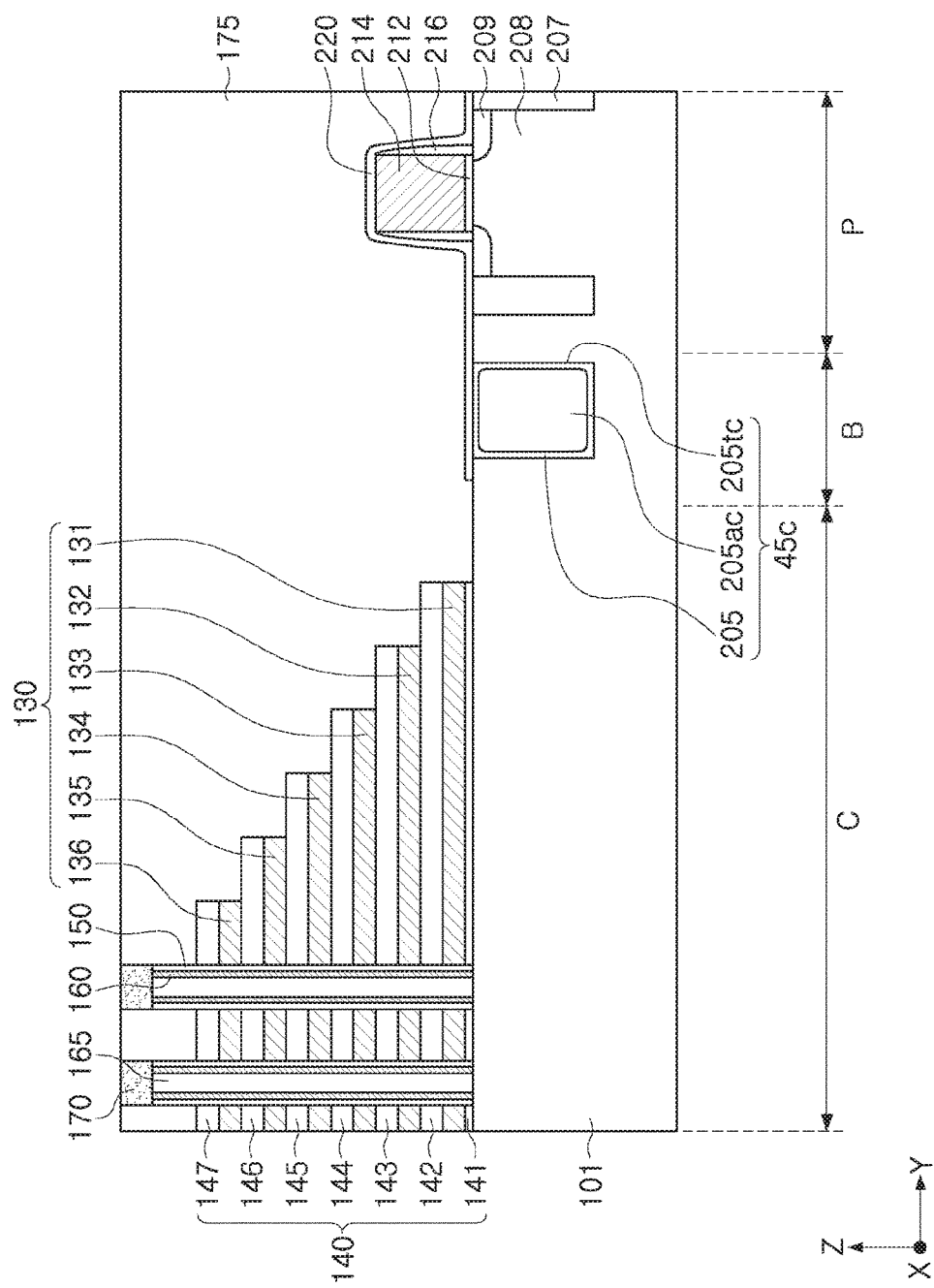
FIG. 11 is a schematic cross-sectional view of a semiconductor device taken along line XI-XI' of FIG. 10 according to example embodiments of inventive concepts.

FIG. 10 is a schematic plan view illustrating a portion of a semiconductor device according to example embodiments of inventive concepts. FIG. 11 is a schematic cross-sectional view of a semiconductor device taken along line XI-XI' of FIG. 10 according to example embodiments of inventive concepts. In a semiconductor device illustrated in FIGS. 10 and 11, constituent elements except for an air gap structure 45c located in a boundary region B are the same as those described above with reference to FIGS. 4 and 5, and thus, descriptions thereof will be omitted.

With reference to FIGS. 10 and 11, the air gap structure 45c may include, for example, a trench 205tc extending in an X-axis direction in a substrate 101, an insulating layer 205 partially filling the trench 205tc, and an air gap 205ac surrounded by the insulating layer 205. The air gap structure 45c may have a ladder form when viewed from above. For instance, the trench 205tc may have a ladder form in which longitudinal trenches are spaced apart from each other to be parallel to each other while extending in an X-axis direction and transversal trenches are extended in a Y-axis direction to connect the longitudinal trenches to each other and are disposed to have a desired (and/or alternatively predetermined) distance therebetween, when viewed from above. The air gap 205ac may be continuously formed without being disconnected in the trench 205tc. A depth of the trench 205tc may be the same as that of a peripheral trench for formation of a device isolation layer 207 located in a peripheral circuit region P. In example embodiments, a depth of the trench 205tc may be greater than that of the peripheral trench for the formation of the device isolation layer 207. An aspect ratio of the trench 205tc may be greater than that of the peripheral trench for the formation of the device isolation layer 207.

Figure 12:
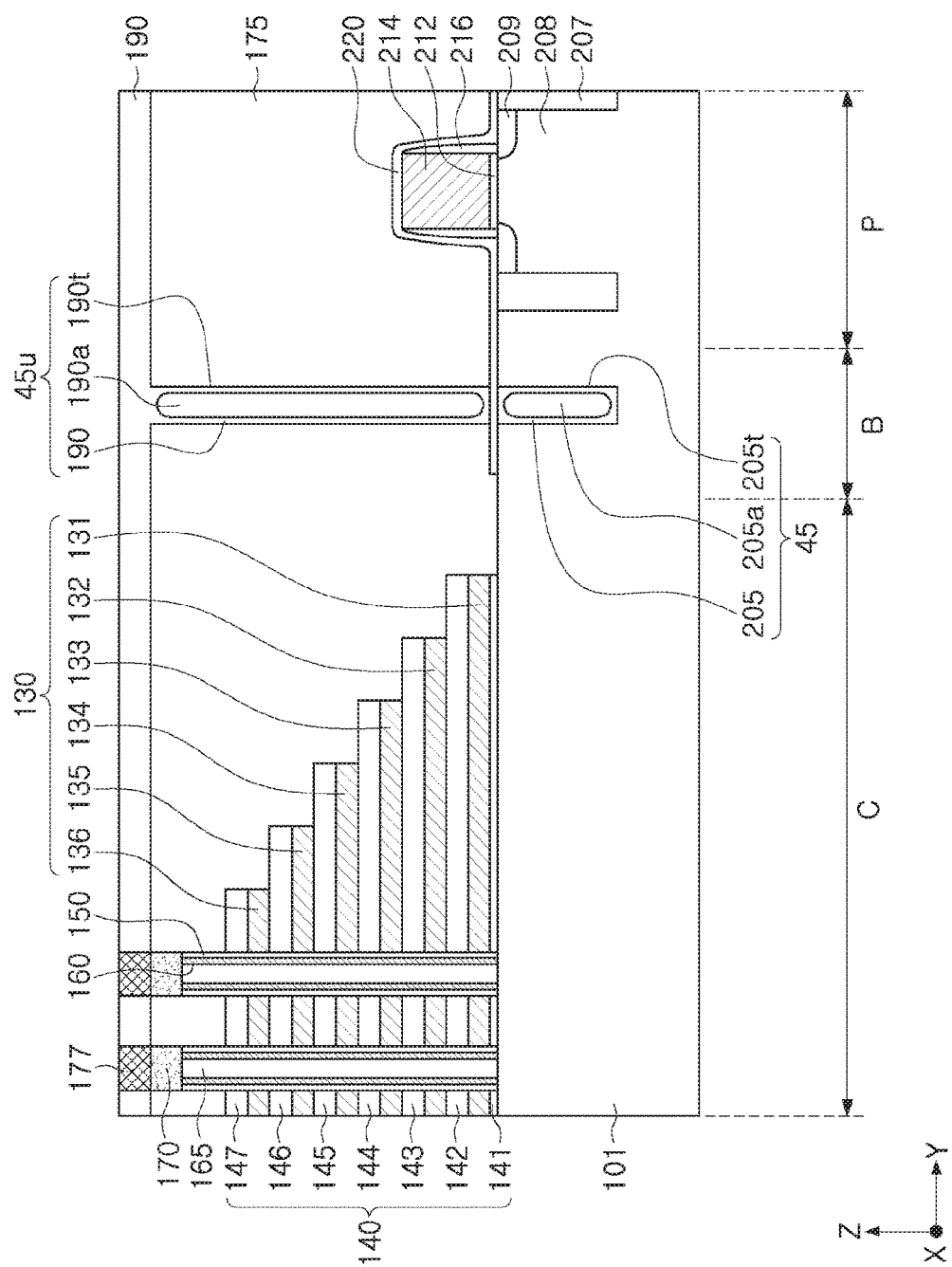
FIG. 12 is a schematic cross-sectional view of a semiconductor device according to example embodiments of inventive concepts.

FIG. 12 is a schematic cross-sectional view of a semiconductor device according to example embodiments of inventive concepts. In FIG. 12, a portion of a memory cell array of a vertical NAND flash memory device described above with reference to FIG. 3 is illustrated as being located in a cell region C. In a semiconductor device illustrated in FIG. 12, constituent elements except for an upper air gap structure 45u formed in a boundary region B are the same as those described above with reference to FIGS. 4 and 5, and thus, a description thereof will be omitted.

With reference to FIG. 12, the upper air gap structure 45u may be formed on an air gap structure 45. The air gap structure 45 and the upper air gap structure 45u may be separated from each other by an etch-stop layer 220. The upper air gap structure 45u may include an opening portion 190t penetrating through an interlayer insulating layer 175, an upper insulating layer 190 partially filling the opening portion 190t, and an air gap 190a surrounded by the upper insulating layer 190. The opening portion 190t may extend in a X-axis direction when viewed from above, in a manner similar to that of FIG. 4 in which the trench 205t extends in an X-axis direction. A width of the opening portion 190t may be different from that of the trench 205t. The opening portion 190t may have a form in which a width thereof is gradually narrowed toward the substrate 101. In FIG. 12, a channel plug 177 may extend through the upper insulating layer 190 to connect to the channel pad 170. The channel plug 177 may be formed of a conductive material (e.g., a metal or metal alloy).

Figure 13:
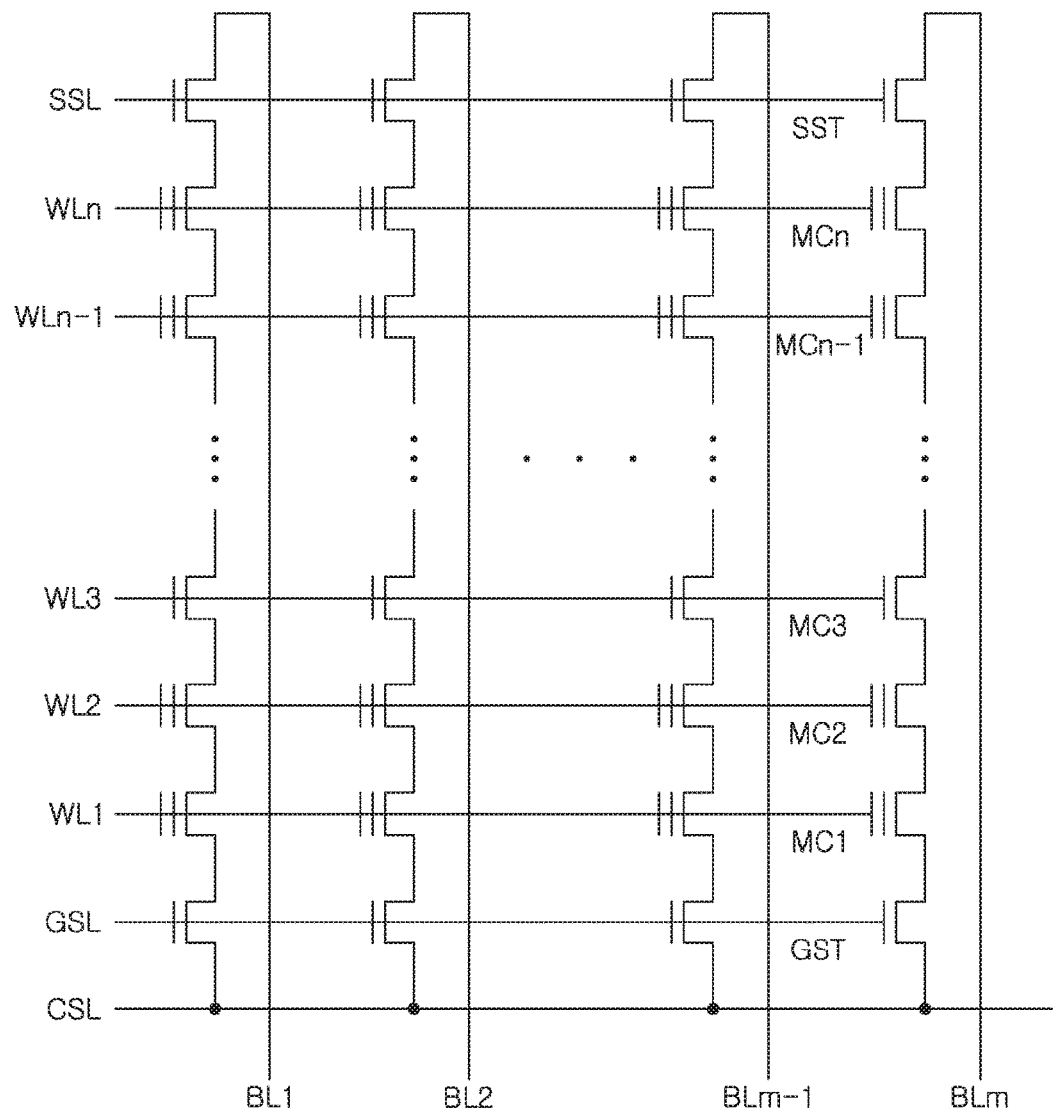
FIG. 13 is an equivalent circuit diagram illustrating a memory cell array of a semiconductor device according to example embodiments of inventive concepts.

FIG. 13 is an equivalent circuit diagram illustrating a memory cell array of a semiconductor device according to example embodiments of inventive concepts. A semiconductor device according to example embodiments of inventive concepts may be a planar NAND flash device.

A memory cell array may be configured of a plurality of memory cell blocks. FIG. 13 may be a drawing illustrating one cell block. With reference to FIG. 13, a cell block may be configured of a plurality of pages. Each page may be configured of a plurality of memory cells MC1 to MCn connected to one word line WL. In a different manner, the cell block may be configured of a plurality of cell strings. Each cell string may include a string selection transistor SST connected to a string select line SSL, a plurality of memory cells MC1 to MCn connected to a plurality of word lines WL1 to WLn, and a ground selection transistor GST connected to a ground select line GSL. The string selection transistor SST may be connected to a bit line BL, and the ground selection transistor GST may be connected to a common source line CSL. The plurality of memory cells MC1 to MCn may be connected to one another in series between one bit line BL and the common source line CSL.

Figure 14:
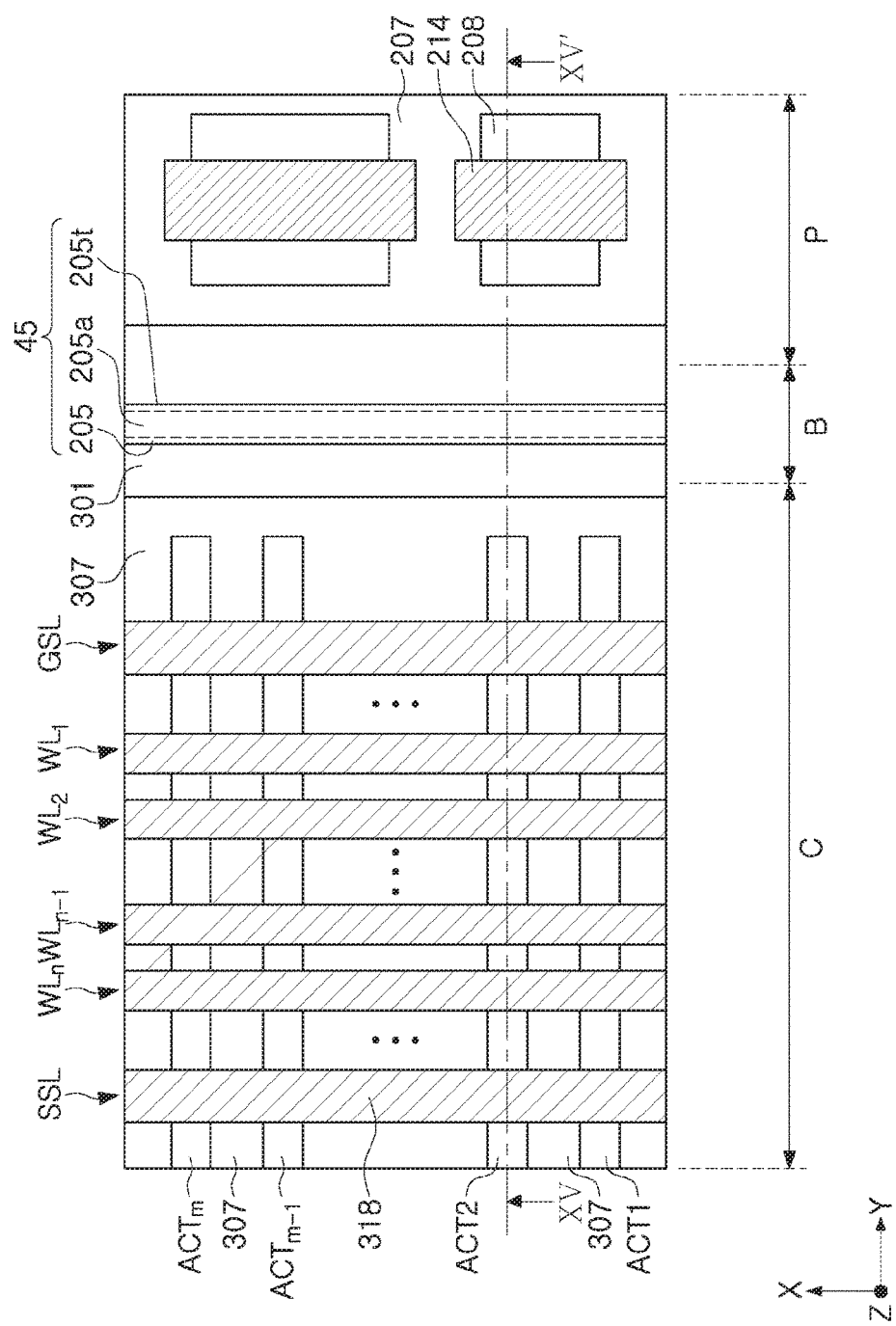
FIG. 14 is a schematic plan view illustrating a portion of a semiconductor device according to example embodiments of inventive concepts.
Figure 15:
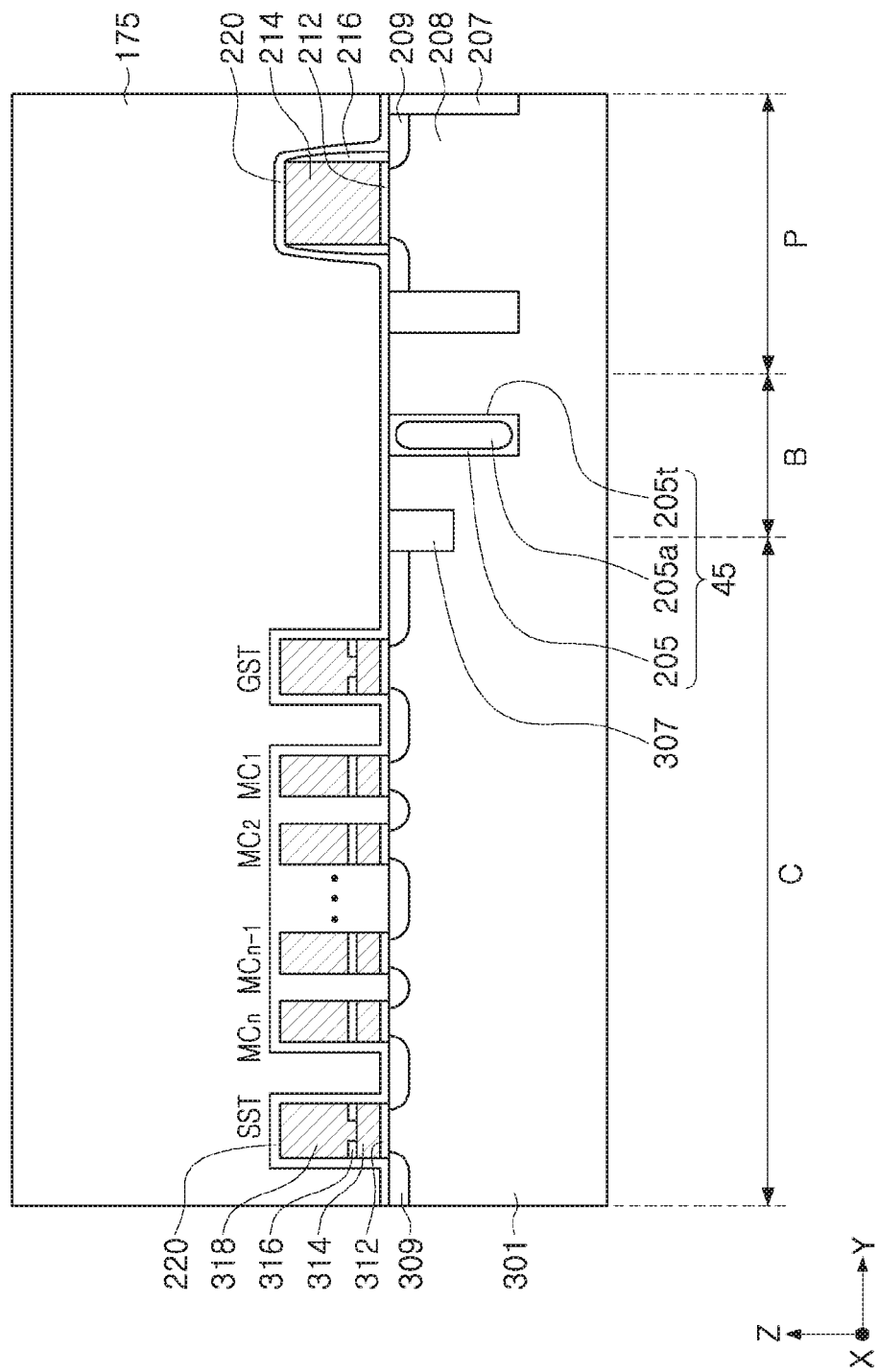
FIG. 15 is a schematic cross-sectional view of a semiconductor device taken along line XV-XV' of FIG. 14 according to example embodiments of inventive concepts.

FIG. 14 is a schematic plan view illustrating a portion of a semiconductor device according to example embodiments of inventive concepts. FIG. 15 is a schematic cross-sectional view of a semiconductor device taken along line XV-XV' of FIG. 14 according to example embodiments of inventive concepts. In a cell region C illustrated in FIGS. 14 and 15, a portion of a memory cell array of the planar NAND flash memory device described above with reference to FIG. 13 may be located. FIG. 14 illustrates that principal configurations are formed on a substrate 101, from which a portion of constituent elements such as an interlayer insulating layer 375, an etch-stop layer 220, and the like are omitted.

With reference to FIG. 14, in a semiconductor device according to example embodiments of inventive concepts, a substrate 301 may include a cell region C, a peripheral circuit region P, and a boundary region B disposed therebetween. The cell region C may include a plurality of active regions ACT1 to ACTm spaced apart from each other in an X-axis direction and extending in a Y-axis direction, and device isolation layers 307 defining the active regions ACT1 to ACTm. The cell region C may include a string selection line SSL configured of a second conductive layer 318, a plurality of word lines WL1 to WLn, and a ground select line GSL. The string select line SSL, the plurality of word lines WL1 to WLn, and the ground select line GSL may be disposed to intersect the active regions ACT1 to ACTm.

The peripheral circuit region P may include a device isolation layer 207 defining an active region 208, and a gate electrode 214 intersecting the active region 208. The active region 208 and the gate electrode 214 may form peripheral transistors. The description of the peripheral circuit region P above with reference to FIG. 4 may be equally applied to the example embodiment.

The air gap structure 45 disposed in the boundary region B may include, for example, a trench 205t extending in a linear form in the substrate 101, an insulating layer 205 partially filling the trench 205t, and an air gap 205a surrounded by the insulating layer 205. The description of the air gap structure 45 above with reference to FIG. 4 may also be equally applied to the example embodiment.

With reference to FIG. 15, a plurality of cell strings may be repeatedly disposed in the cell region C, and as a portion thereof, a structure of one cell string is illustrated. One cell string may include a string selection transistor SST connected to a bit line BL (see FIG. 13), a ground selection transistor GST connected to a common source line CSL (see FIG. 13), and a plurality of memory cells MC1 to MCn disposed between the string selection transistor SST and the ground selection transistor GST. Each memory cell MC may include an insulating layer 312, a first conductive layer 314, a blocking insulating layer 316, and a second conductive layer 318 on the substrate. The first conductive layer 314 may be electrically insulated from the second conductive layer 318 by the blocking insulating layer 316, and may be a floating gate insulated from the substrate 301 by the insulating layer 312. The second conductive layer 318 may be a control gate. The string selection transistor SST and the ground selection transistor GST may include the insulating layer 312, the first conductive layer 314, the blocking insulating layer 316, and the second conductive layer 318 formed on the substrate, and the first conductive layer 314 and the second conductive layer 318 may be electrically connected to each other by removing a portion of the blocking insulating layer 316. An impurity region 309 doped with an n-type impurity may be included in the substrate between memory cells MC, between memory cells MCn adjacent to the string selection transistors SST, and between memory cells MC1 adjacent to the ground selection transistor GST.

The air gap structure 45 disposed in the boundary region B may include, for example, a trench 205t formed by etching the substrate 101, an insulating layer 205 partially filling the trench 205t, and an air gap 205a surrounded by the insulating layer 205. The description of the air gap structure 45 above with reference to FIG. 5 may be equally applied to the example embodiment.

In the case of the example embodiment, the contents of the peripheral circuit region P described above with reference to FIG. 5 may also be equally applied thereto.

Figure 16:
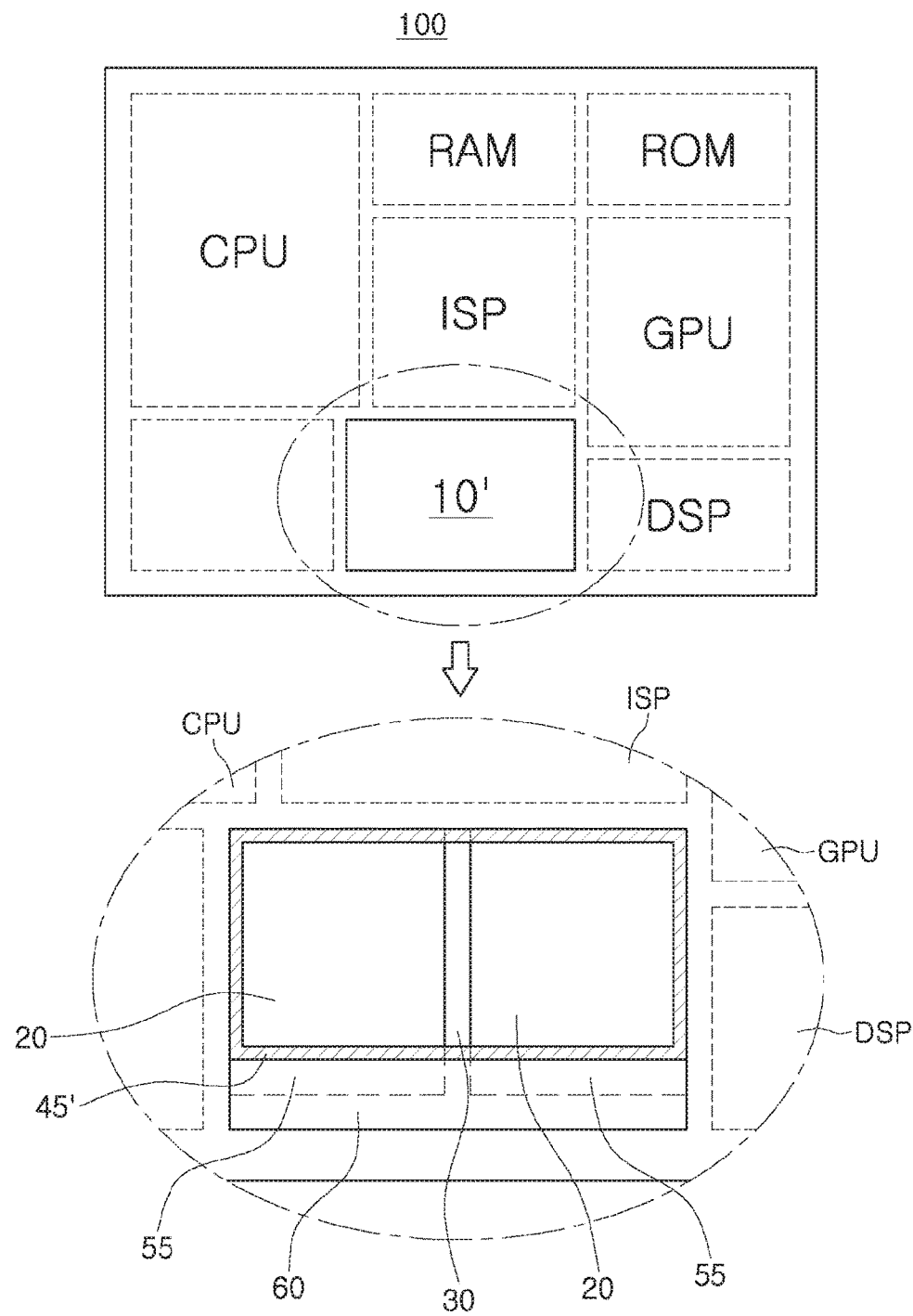
FIGS. 16 and 17 are schematic layout diagrams of semiconductor devices according to example embodiments of inventive concepts.
Figure 17:
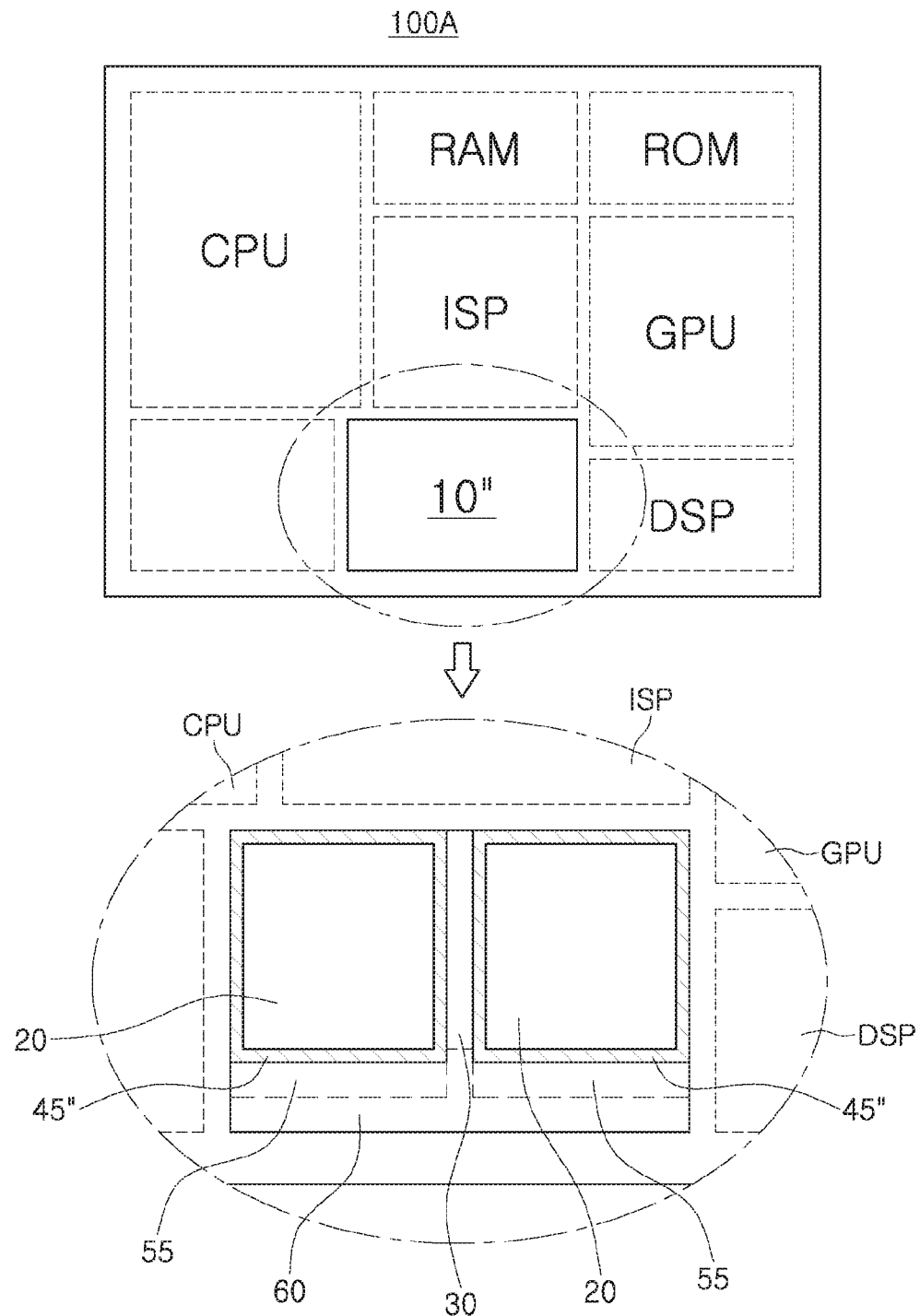

FIGS. 16 and 17 are schematic layout diagrams of semiconductor devices according to example embodiments of inventive concepts. Semiconductor devices 100 and 100A illustrated in FIGS. 16 and 17 may be system-on-chip (SoC) devices in which memory devices and various types of logic devices are included in a single chip, respectively.

With reference to FIG. 16, the semiconductor device 100 may include memory elements such as a non-volatile memory device 10', a random access memory (RAM), a read only memory (ROM), and the like, and logic elements such as a central processing unit (CPU), a graphic processing unit (GPU), an image signal processor (ISP), a digital signal processor (DSP) and the like, formed on a single substrate. The semiconductor device 100 may include various controllers or interfaces. A layout relationship between a plurality of devices illustrated in FIG. 16 is provided by way of example, and thus, is not limited thereto. The semiconductor device 100 may include various elements according to application fields.

The non-volatile memory device 10' may have a structure similar to that of the semiconductor device 10 illustrated in FIG. 2. The non-volatile memory device 10' may include a cell region and a peripheral circuit region. The cell region may include a plurality of memory cell arrays 20. The peripheral circuit region may include a row decoder 30, a core logic circuit 55, and other peripheral circuits 60. The non-volatile memory device 10' may include memory cell arrays 20 disposed on both sides of the row decoder 30, based on the row decoder 30, and core logic circuits 55 disposed to correspond to positions of the memory cell arrays 20, respectively. In addition, the non-volatile memory device 10' may include other peripheral circuits 60 including a high voltage generating circuit and the like in the vicinity of the core logic circuit 55.

Heat may be generated in a plurality of logic elements, for example, CPU, GPU, and the like, disposed in the vicinity of the non-volatile memory device 10' while the semiconductor device 100 operates. In addition, heat may also be generated in the core logic circuit 55 of the non-volatile memory device 10' and the like. The generated heat may be transferred to the memory cell arrays 20 of the non-volatile memory device 10', thereby deteriorating cell characteristics.

In order to block or reduce heat transferred to the cell region from the peripheral circuit region and the logic elements, the non-volatile memory device 10' may include an air gap structure 45' between the memory cell arrays 20 and the core logic circuits 55 and between the memory cell arrays 20 and the logic elements. The non-volatile memory device 10' may include one air gap structure 45' surrounding the cell region in a quadrangular circumferential form.

By blocking or reducing heat transferred from the core logic circuits 55 and the logic elements to the memory cell arrays 20 via the air gap structure 45', memory cell characteristics may be limited and/or prevented from being deteriorated. With respect to a structure of the air gap structure 45', the structures described above with reference to FIGS. 4 to 12 may be equally applied thereto.

With reference to FIG. 17, the semiconductor device 100A may include memory elements such as a non-volatile memory device 10", a random access memory (RAM), a read only memory (ROM), and the like, and logic elements such as a central processing unit (CPU), a graphic processing unit (GPU), an image signal processor (ISP), a digital signal processor (DSP), and the like, formed on a single substrate. In addition, the semiconductor device 100A may include various controllers or interfaces. Layout relationship between a plurality of devices illustrated in FIG. 17 are provided by way of example, and thus, are not limited thereto. The semiconductor device 100A may include various elements according to application fields.

The non-volatile memory device 10" may have a structure similar to that of the non-volatile memory device 10' illustrated in FIG. 16. The non-volatile memory device 10" may include an air gap structure 45" disposed in a form different from that of the air gap structure 45' illustrated in FIG. 16. The cell region may include a plurality of memory cell arrays 20. In the example embodiment, the non-volatile memory device 10" may include the air gap structure 45" between the memory cell array 20 and the core logic circuit 55 and between the memory cell array 20 and the logic elements. The non-volatile memory device 10" may include a plurality of air gap structures 45" surrounding the memory cell arrays 20, respectively, in a quadrangular circumferential form. By blocking or reducing heat transferred from the core logic circuits 55 and the logic elements to the memory cell arrays 20 via the air gap structure 45", memory cell characteristics may be limited and/or prevented from being deteriorated. With respect to a structure of the air gap structure 45", the structures described above with reference to FIGS. 4 to 12 may be equally applied thereto.

As set forth above, according to example embodiments of inventive concepts, an air gap structure may be located between a cell array region and a peripheral circuit region of a semiconductor device, thereby limiting and/or preventing heat being transferred from the peripheral circuit region to the cell array region and thus limiting and/or preventing heat characteristics from being deteriorated.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A semiconductor device comprising:
    a substrate including a cell region, a peripheral circuit region, and a boundary region,
        the boundary region being between the cell region and the peripheral circuit region,
    a plurality of memory cell arrays on the cell region, and
    an air gap structure including a trench formed in the boundary region of the substrate, the air gap structure defining an air gap, wherein the air gap structure includes one of
    a first air gap structure that is continuous, without being disconnected, to correspond to all of the plurality of memory cell arrays, the first air gap structure extending along sides of the plurality of memory cell arrays in a single direction,
    a second air gap structure that includes a plurality of trenches that include the trench and are spaced apart from each other while having linear forms,
    a third air gap structure that has a zigzag form when viewed from above, and
    a fourth air gap structure that has a ladder form when viewed from above.

2. The semiconductor device of claim 1, further comprising:
    a plurality of air gap structures, wherein
    each one of the air gap structures extends in a single direction along one side of a corresponding one of the memory cell arrays.

3. The semiconductor device of claim 2, wherein a length of the air gap structures respectively corresponds to a length of the one side of each of the plurality of memory cell arrays.

4. The semiconductor device of claim 1, wherein
    the air gap structure includes the first air gap structure.

5. A semiconductor device comprising:
a substrate including a boundary region between a cell region and a peripheral circuit region, the boundary region including a trench;
a core logic circuit on the peripheral circuit region;
a plurality of memory cell arrays on the cell region, the plurality of memory cell arrays including a plurality of gate electrode layers stacked on the substrate and a plurality of channels extending substantially perpendicular to an upper surface of the substrate to penetrate through the plurality of gate electrode layers; and
an air gap structure defining an air gap in the trench formed in the boundary region.

6. The semiconductor device of claim 1, wherein
the air gap structure includes the second air gap structure, and
depths of the plurality of trenches are equal to each other.

7. The semiconductor device of claim 1, wherein
the air gap structure includes the second air gap structure, and
depths of the plurality of trenches are different from each other.

8. The semiconductor device of claim 1, wherein the air gap structure includes the third air gap structure.

9. The semiconductor device of claim 1, wherein the air gap structure includes the fourth air gap structure.

10. The semiconductor device of claim 1, wherein the air gap structure is configured to limit heat from being transferred to the cell region from the peripheral circuit region.

11. The semiconductor device of claim 5, wherein the air gap structure has a linear form.

12. The semiconductor device of claim 5, further comprising:
a plurality of air gap structures, wherein
the plurality of air gap structures include the air gap structure,
the boundary region includes a plurality of trenches formed in the substrate,
the plurality of trenches include the trench,
each one of the air gap structures extends in a single direction along one side of a corresponding one of the memory cell arrays.

13. The semiconductor device of claim 5, wherein the air gap structure has a zig zag form, or a ladder form, when viewed from above.

14. The semiconductor device of claim 5, wherein the air gap structure includes an insulating layer in the trench, and the insulating layer defines the air gap.

15. The semiconductor device of claim 5, wherein
the plurality of memory cell arrays each include a plurality of memory cell strings on the cell region of the substrate, and
the memory cell strings each include a plurality of memory cells stacked on top of each other between a ground selection transistor and a string selection transistor.

* * * * *